(12) United States Patent
Kim et al.

(10) Patent No.: US 11,665,841 B2
(45) Date of Patent: May 30, 2023

(54) HINGE MODULE AND FOLDABLE ELECTRONIC DEVICE INCLUDING THE SAME

(71) Applicant: Samsung Electronics Co., Ltd., Gyeonggi-do (KR)

(72) Inventors: Dooryong Kim, Gyeonggi-do (KR); Jongmin Kang, Gyeonggi-do (KR); Jungjin Kim, Gyeonggi-do (KR); Jongyoon Kim, Gyeonggi-do (KR); Inyoul Baek, Gyeonggi-do (KR); Chungkeun Yoo, Gyeonggi-do (KR); Doosun Yoon, Gyeonggi-do (KR); Suman Lee, Gyeonggi-do (KR); Jonghwan Choi, Gyeonggi-do (KR)

(73) Assignee: Samsung Electronics Co., Ltd

( * ) Notice: Subject to any disclaimer, the term of this patent is extended or adjusted under 35 U.S.C. 154(b) by 337 days.

(21) Appl. No.: 16/794,666

(22) Filed: Feb. 19, 2020

(65) Prior Publication Data

US 2020/0267859 A1 Aug. 20, 2020

(30) Foreign Application Priority Data

Feb. 19, 2019 (KR) ........................ 10-2019-0019574

(51) Int. Cl.
| | | |
|---|---|---|
| H05K 5/02 | (2006.01) | |
| F16C 11/04 | (2006.01) | |
| E05D 11/00 | (2006.01) | |
| E05D 11/06 | (2006.01) | |

(52) U.S. Cl.
CPC ....... *H05K 5/0226* (2013.01); *E05D 11/0054* (2013.01); *E05D 11/06* (2013.01); *F16C 11/04* (2013.01); *E05Y 2201/10* (2013.01); *E05Y 2201/224* (2013.01); *E05Y 2900/606* (2013.01)

(58) Field of Classification Search
CPC . E05D 11/06; E05D 11/0054; E05Y 2201/10; E05Y 2201/224; E05Y 2900/606; G06F 1/1681; F16C 11/04; H05K 5/0226
See application file for complete search history.

(56) References Cited

U.S. PATENT DOCUMENTS

| | | | |
|---|---|---|---|
| 9,366,064 B1 | 6/2016 | Chen et al. | |
| 9,404,298 B1 | 8/2016 | Chen et al. | |
| 9,512,655 B2 * | 12/2016 | Kuo | .......................... E05D 1/04 |

(Continued)

FOREIGN PATENT DOCUMENTS

| | | |
|---|---|---|
| CN | 204554252 | 8/2015 |
| CN | 207018340 | 2/2018 |

(Continued)

OTHER PUBLICATIONS

International Search Report dated Jun. 17, 2020 issued in counterpart application No. PCT/KR2020/002247, 4 pages.

(Continued)

*Primary Examiner* — Victor D Batson
*Assistant Examiner* — Matthew J Sullivan
(74) *Attorney, Agent, or Firm* — The Farrell Law Firm, P.C.

(57) ABSTRACT

Disclosed is a hinge module a hinge structure for a wireless communication device, the hinge structure preventing a rotary structure from being separated from a fixed structure in a flat state and a folded state.

15 Claims, 15 Drawing Sheets

(56) References Cited

U.S. PATENT DOCUMENTS

| | | | |
|---|---|---|---|
| 9,518,414 B1* | 12/2016 | Chen | E05D 11/082 |
| 9,759,242 B2* | 9/2017 | Hsu | G06F 1/16 |
| 9,784,406 B1 | 10/2017 | Lin | |
| 9,797,546 B1* | 10/2017 | Lin | F16M 13/00 |
| 9,822,567 B1* | 11/2017 | Lin | E05D 11/06 |
| 10,001,815 B1* | 6/2018 | Yao | H05K 5/0234 |
| 10,036,188 B1* | 7/2018 | Yao | E05D 3/122 |
| 10,168,746 B2* | 1/2019 | Senatori | G06F 1/1616 |
| 10,310,551 B2 | 6/2019 | Bae et al. | |
| 10,317,951 B2* | 6/2019 | Senatori | G06F 1/1607 |
| 10,365,691 B2 | 7/2019 | Bae et al. | |
| 10,664,021 B1* | 5/2020 | Hsu | G06F 1/1681 |
| 11,016,541 B2* | 5/2021 | Lin | E05D 3/122 |
| 11,301,006 B2* | 4/2022 | Hsu | G06F 1/1641 |
| 11,320,871 B2* | 5/2022 | Lin | G06F 1/1681 |
| 11,349,970 B1* | 5/2022 | Zhao | E05D 3/122 |
| 2014/0293534 A1 | 10/2014 | Siddiqui | |
| 2015/0260230 A1 | 9/2015 | Xu | |
| 2016/0097227 A1 | 4/2016 | Hsu | |
| 2018/0224900 A1 | 8/2018 | Senatori | |
| 2020/0183464 A1* | 6/2020 | Lin | G06F 1/1616 |
| 2020/0371561 A1* | 11/2020 | Lin | G06F 1/1681 |
| 2020/0409427 A1* | 12/2020 | Hsu | E05D 1/04 |
| 2021/0055763 A1* | 2/2021 | Park | E05D 1/04 |
| 2021/0195775 A1* | 6/2021 | Zhao | H05K 5/0226 |
| 2021/0381289 A1* | 12/2021 | Hsu | H04M 1/022 |
| 2022/0083106 A1* | 3/2022 | Su | G06F 1/1681 |
| 2022/0167514 A1* | 5/2022 | Huang | G06F 1/1681 |

FOREIGN PATENT DOCUMENTS

| | | |
|---|---|---|
| KR | 1020080067458 | 7/2008 |
| KR | 1020100035528 | 4/2010 |
| KR | 1020160121350 | 10/2016 |
| WO | WO 2017/082910 | 5/2017 |

OTHER PUBLICATIONS

European Search Report dated Jun. 8, 2022 issued in counterpart application No. 20760306.9-1224, 10 pages.

Korean Office Action dated Feb. 9, 2023 issued in counterpart application No. 10-2019-0019574, 21 pages.

* cited by examiner

HINGE MODULE AND FOLDABLE ELECTRONIC DEVICE INCLUDING THE SAME

CROSS-REFERENCE TO RELATED APPLICATION(S)

This application is based on and claims priority under 35 U.S.C. § 119 to Korean Patent Application No. 10-2019-0019574, filed on Feb. 19, 2019, in the Korean Intellectual Property Office, the entire disclosure of which is incorporated herein by reference.

BACKGROUND

1. Field

The disclosure relates generally to an electronic device, and more particularly, to a hinge module and the electronic device including the same.

2. Description of Related Art

A mobile electronic device, such as a smartphone, may provide various functions, such as a telephone call, video playback, and Internet search, based on various types of applications. The use of a wide screen for such functions may be desired. However, portability may be reduced with such a screen size increase. Furthermore, devices in the related art with wide screens have limitations in operability.

Specifically, a rotary structure of a hinge structure in the related art may be separated from a fixed structure in a folded state. To solve this problem, a stopper may be provided on the fixed structure. However, the stopper in the related art has made it difficult to insert the rotary structure into the fixed structure.

Accordingly, there is a need in the art for a foldable electronic device capable of conveniently increasing portability using a folding structure.

SUMMARY

Aspects of the disclosure are to address at least the above-mentioned problems and/or disadvantages and to provide at least the advantages described below.

Accordingly, an aspect of the disclosure is to provide a hinge structure for preventing a rotary structure from being separated from a fixed structure in a flat state and a folded state, and a new assembly structure capable of being applied to a hinge structure including a stopper.

In accordance with an aspect of the disclosure, a hinge module includes a hinge module including a hinge housing, and a hinge structure disposed in the hinge housing, wherein the hinge structure includes a fixed structure including a front surface, a rear surface opposite to the front surface and fixed to the inside of the hinge housing, and a side surface formed between the front surface and the rear surface, a first recess structure configured to form a first recess that is concavely formed on the front surface of the fixed structure, the first recess structure including a first inner wall facing toward the first recess, a second inner wall opposite the first inner wall, and a first bottom surface formed between the first inner wall and the second inner wall, wherein a first stopper protruding toward the front surface of the fixed structure is formed on the first bottom surface, a second recess structure configured to form a second recess that is concavely formed on the front surface of the fixed structure, the second recess structure including a third inner wall facing toward the second recess, a fourth inner wall opposite the third inner wall, and a second bottom surface formed between the third inner wall and the fourth inner wall, wherein a second stopper protruding toward the front surface of the fixed structure is formed on the second bottom surface, a first rotary structure disposed between the first inner wall and the second inner wall and configured to rotate about a first virtual axis of rotation, the first rotary structure including a first support portion facing the first inner wall, a second support portion facing the second inner wall, and a first receiving groove that is formed between the first support portion and the second support portion and in which at least part of the first stopper is received, and a second rotary structure disposed between the third inner wall and the fourth inner wall and configured to rotate about a second virtual axis of rotation that is parallel to the first virtual axis of rotation, the second rotary structure including a third support portion facing the third inner wall, a fourth support portion facing the fourth inner wall, and a second receiving groove that is formed between the third support portion and the fourth support portion and in which at least part of the second stopper is received, wherein the first stopper protrudes from the first bottom surface such that a distance from the first stopper to the first virtual axis of rotation is less than a maximum radius of rotation of the first rotary structure having the first virtual axis of rotation as a center of the first rotary structure, and wherein the second stopper protrudes from the second bottom surface such that a distance from the second stopper to the second virtual axis of rotation is less than a maximum radius of rotation of the second rotary structure having the second virtual axis of rotation as the center of the second rotary structure.

In accordance with another aspect of the disclosure, an electronic device includes a housing structure including a first housing, a second housing, and a hinge housing disposed between the first housing and the second housing, a flexible display disposed on the housing structure so as to extend from the first housing to the second housing, the flexible display including a first area formed of a first flat surface, a second area formed of a second flat surface, and a folding area formed between the first area and the second area and formed of a third flat surface or a curved surface, and a hinge structure disposed in the hinge housing, the hinge structure being disposed between the first housing and the second housing to rotate the first housing and the second housing about a folding axis, wherein the hinge structure includes a fixed structure fixed to an inside of the hinge housing, a first rotary structure connected with the first housing and coupled to the fixed structure so as to be rotatable about a first virtual axis of rotation, and a second rotary structure connected with the second housing and coupled to the fixed structure so as to be rotatable about a second virtual axis of rotation, wherein the fixed structure includes a first recess in which at least part of the first rotary structure is disposed, a first stopper protruding from a bottom surface of the first recess in a direction toward the flexible display, a second recess in which at least part of the second rotary structure is disposed, and a second stopper protruding from a bottom surface of the second recess in the direction toward the flexible display, wherein the first rotary structure includes a first receiving groove in which at least part of the first stopper is received, wherein the second rotary structure includes a second receiving groove in which at least part of the second stopper is received, wherein the first stopper makes contact with a bottom surface of the first receiving groove when the first rotary structure reaches a maximum rotation angle, and wherein the second stopper makes contact with a bottom surface of the second receiving groove when the second rotary structure reaches a maximum rotation angle.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1A:
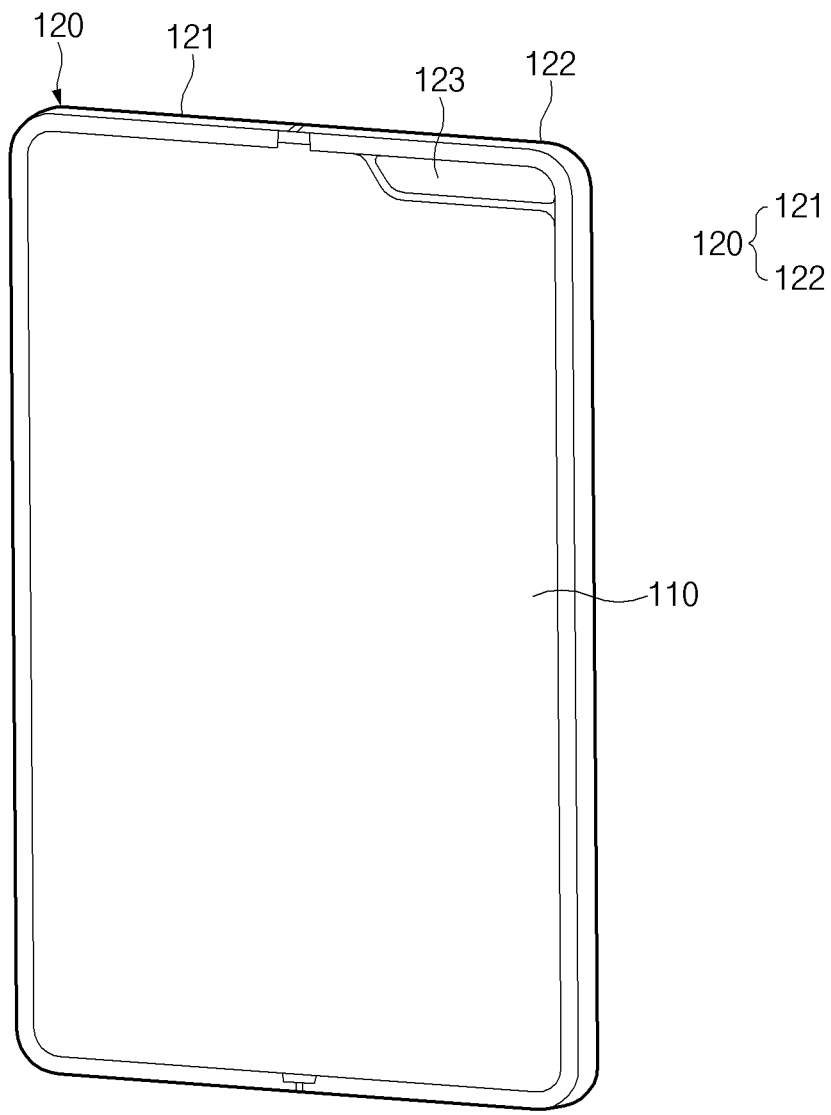
FIG. 1A illustrates the front exterior of an electronic device in a first state according to an embodiment.

Hereinafter, embodiments will be described in detail in conjunction with the accompanying drawings. A detailed description of known functions or configurations incorporated herein will be omitted for the sake of clarity and conciseness.

The terms which will be described below are defined in consideration of the functions in the disclosure, and may be different according to users, intentions of the users, or customs. Therefore, the definitions of the terms should be made based on the contents throughout the specification.

The electronic device according to an embodiment may be one of various types of electronic devices, such as a portable communication device (e.g., a smartphone), a computer device, a portable multimedia device, a portable medical device, a camera, a wearable device, or a home appliance. However, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements.

It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and do not limit the components in other aspects, such as importance or order. It is to be understood that if an element, such as a first element, is referred to, with or without the term "operatively" or "communicatively", as "coupled with," "coupled to," "connected with," or "connected to" another element, such as a second element, this indicates that the first element may be directly coupled with the second element wiredly, wirelessly, or via a third element.

Figure 1B:
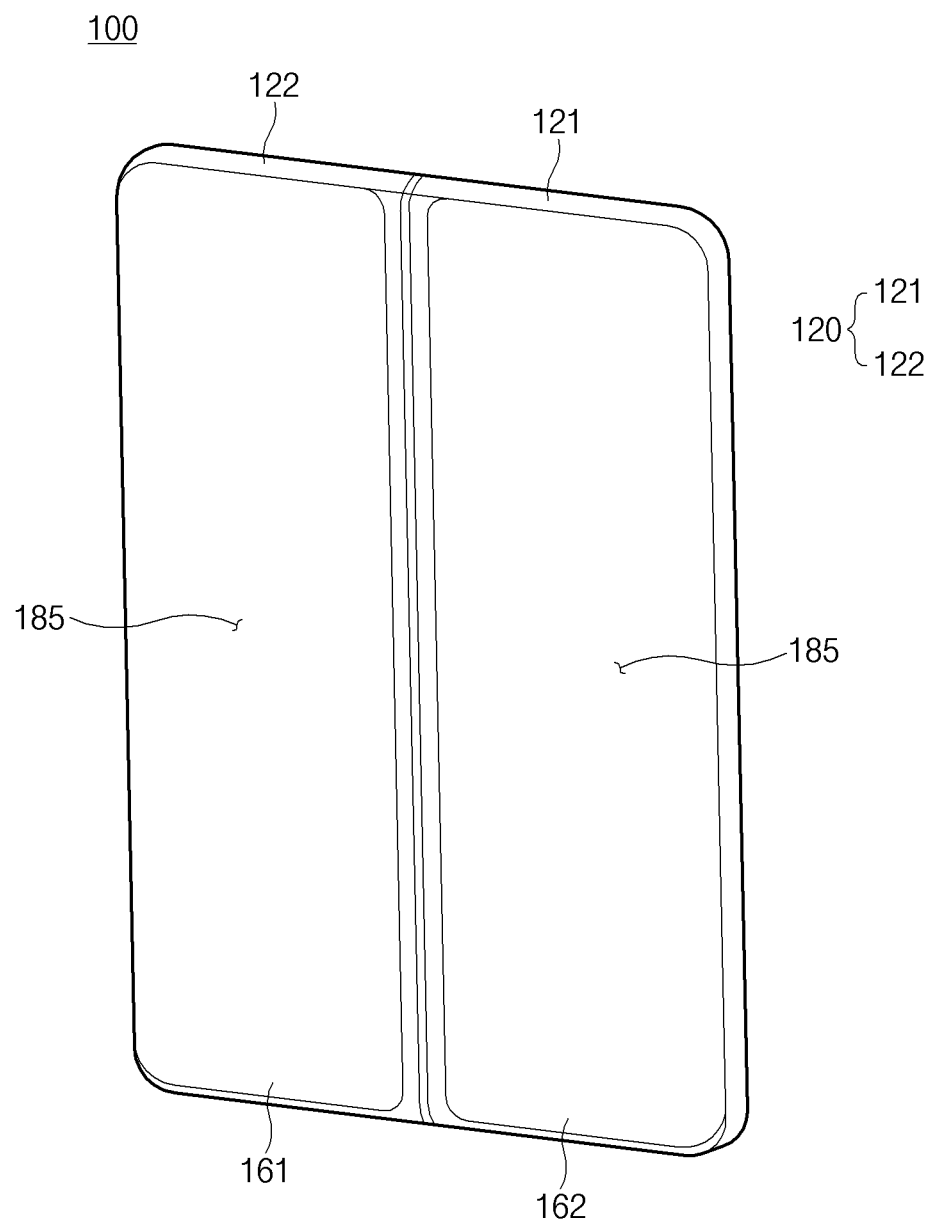
FIG. 1B illustrates the rear exterior of the electronic device in the first state according to an embodiment.
Figure 1C:
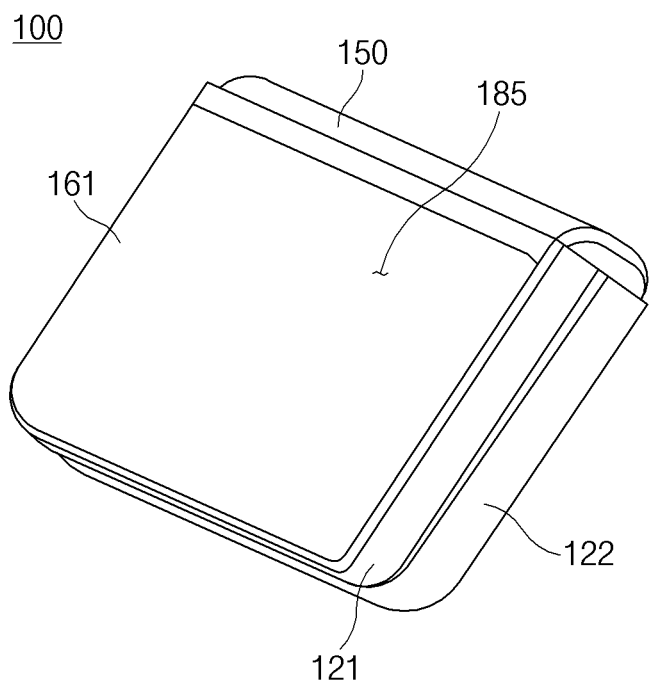
FIG. 1C illustrates the exterior of the electronic device in a second state according to an embodiment.
Figure 1D:
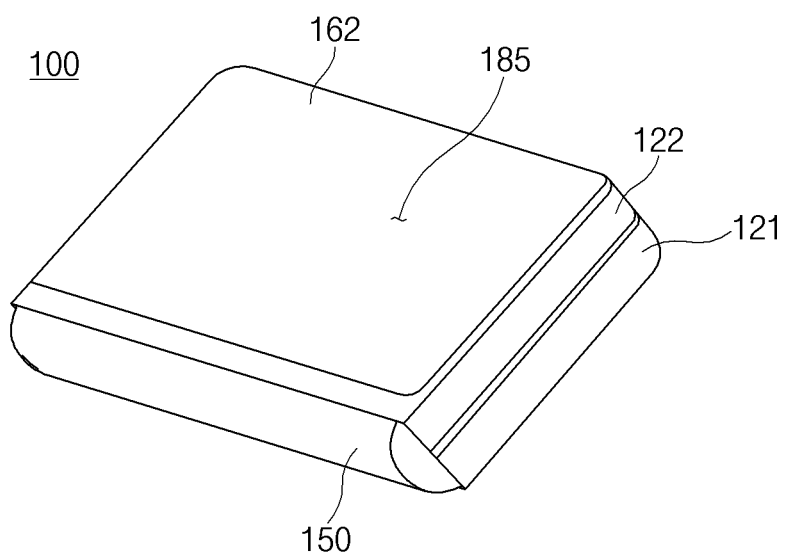
FIG. 1D illustrates another example of the exterior of the electronic device in the second state according to an embodiment.

FIG. 1A illustrates the front exterior of an electronic device in a first state according to an embodiment. FIG. 1B illustrates the rear exterior of the electronic device in the first state according to an embodiment. FIG. 1C illustrates the exterior of the electronic device in a second state according to an embodiment. FIG. 1D illustrates another example of the exterior of the electronic device in the second state according to an embodiment.

FIGS. 1A and 1B illustrate the front side and the rear side of the electronic device 100 in the first state (e.g., a flat state or an unfolded state), and FIGS. 1C and 1D are perspective views including the upper and lower sides (or the right and left sides) of the electronic device 100 in the second state (e.g., a folded state).

Referring to FIGS. 1A to 1D, the electronic device 100 includes a housing 120 including a first housing 121 and a second housing 122, a flexible display 110, a first cover 161, a second cover 162, and a hinge housing 150 having a hinge structure disposed therein.

Depending on an arrangement, the first housing 121 may be disposed so as to be continuous with the second housing 122 (e.g., when a folding area of the flexible display 110 is flat), or may be disposed side by side with the second housing 122. Alternatively, when the central portion of the flexible display 110 is folded, the first housing 121 and the second housing 122 may be disposed such that one side of the first housing 121 faces one side of the second housing 122.

At least part of the first housing 121 may be formed of a metallic material or of a non-metallic material. For example, the first housing 121 may be formed of a material having a predetermined stiffness to support at least part of the flexible display 110. One area of the flexible display 110 may be disposed on part of the front side of the first housing 121, which may include an empty space or may be coupled with the first cover 161 to form an empty space. Electronic components (e.g., a printed circuit board, and components, such as at least one processor, at least one memory, and a battery, which are mounted on the printed circuit board) that are required to drive the flexible display 110 may be disposed in the empty space. The periphery of the first housing 121 may be provided in a form that surrounds a periphery on one side of the flexible display 110.

Depending on an arrangement, the second housing 122 may be disposed side by side with the first housing 121, or may be disposed such that at least one side of the second housing 122 faces the first housing 121. The second housing 122 may be formed of the same material as that of the first housing 121. The second housing 122 may be disposed to be horizontally or vertically symmetric to the first housing 121, and at least part of the remaining area of the flexible display 110 may be disposed and supported on the front side of the second housing 122. Similar to the first housing 121, the second housing 122 may include an empty space or may be coupled with the second cover 162 to form an empty space. Electronic components required to drive the flexible display 110 may be disposed in the empty space. The periphery of the second housing 122 may be provided in a form that surrounds a periphery on an opposite side of the flexible display 110.

The electronic device 100 may include, on a side of the second housing 122, a sensor arrangement area 123 in which at least one sensor associated with operating a specific function of the electronic device 100 is disposed. For example, at least one of a proximity sensor, an illuminance sensor, an iris sensor, an image sensor (or a camera), or a fingerprint sensor may be disposed in the sensor arrangement area 123. The sensor arrangement area 123 may be located on the rear side of the electronic device 100 when the at least one sensor is disposed on the rear side of the electronic device 100.

Depending on the folded or flat state of the electronic device 100, the hinge housing 150 may be hidden by one side of the first housing 121 and one side of the second housing 122 (e.g., a flat state of the housing 120), or may be exposed to the outside (e.g., a folded state of the housing 120). As illustrated in FIGS. 1A and 1B, the hinge housing 150 may be hidden by the first housing 121 and the second housing 122 when the first housing 121 and the second housing 122 are arranged side by side. As illustrated in FIGS. 1C and 1D, the hinge housing 150 may be exposed to the outside from between lateral portions of the first housing 121 and the second housing 122 when one side of the first housing 121 and one side of the second housing 122 face each other.

At least part of the flexible display 110 may be foldable. The flexible display 110 may include a first area disposed on the first housing 121, a second area disposed on the second housing 122, and a folding area (see 113 in FIG. 2) within a predetermined range with respect to the area to which the first housing 121 and the second housing 122 are adjacent. At least part of the folding area may be flexible.

Figure 2:
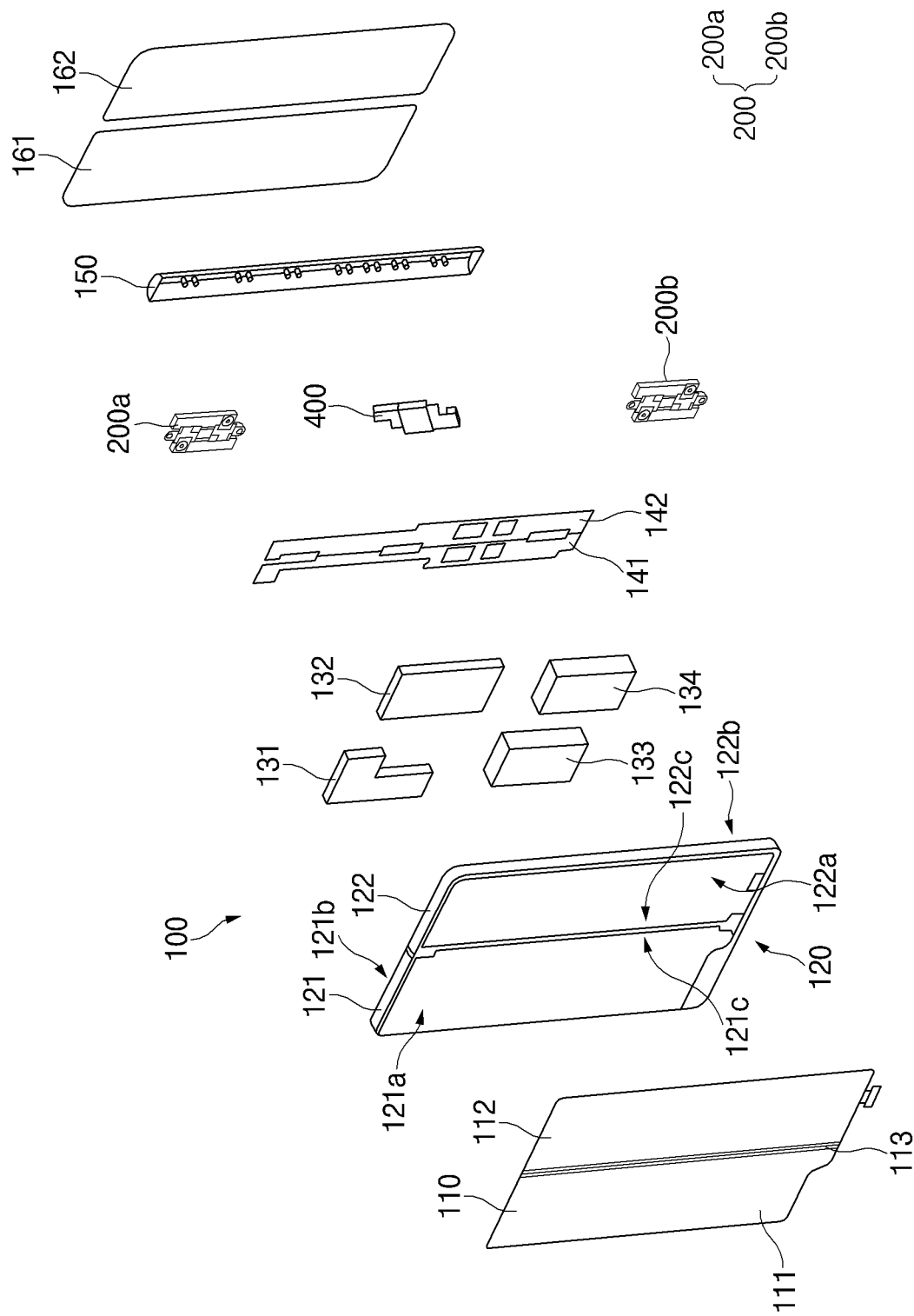
FIG. 2 illustrates an exploded perspective view of the electronic device according to an embodiment.

FIG. 2 illustrates an exploded perspective view of the electronic device according to an embodiment.

Referring to FIG. 2, the electronic device 100 includes the flexible display 110, the housing 120, a first printed circuit board 131 and a second printed circuit board 132, a first battery 133 and a second battery 134, hinge plates 141 and 142, a hinge structure 200, a first cover 161 and a second cover 162.

The flexible display 110 includes a first area 111, a second area 112, and a folding area 113 having a predetermined area that is located on a central portion while the flexible display 110 is folded. At least part of the first area 111 may be fixedly attached to the first housing 121. At least part of the second area 112 may be fixedly attached to the second housing 122. The folding area 113 may be disposed so as not to be fixed (or attached) to the first housing 121 and the second housing 122. Accordingly, while the flexible display 110 is folded or unfolded, the folding area 113 may be moved without being attached to the first housing 121 and the second housing 122.

The first housing 121 includes a first surface 121a and a second surface 121b opposite to the first surface 121a, and the second housing 122 may include a third surface 122a and a fourth surface 122b opposite to the third surface 122a. The first housing 121 and the second housing 122 may be folded or unfolded about the hinge structure 200. When the flexible display 110 is folded (or the first housing 121 and the second housing 122 are stacked on each other), the third surface 122a may face the first surface 121a, and when the flexible display 110 is flat, the first surface 121a and the third surface 122a may face the same direction, and a first peripheral portion 121c of the first housing 121 may be connected with a second peripheral portion 122c of the second housing 122. The flexible display 110 may be disposed across at least part of the first surface 121a and at least part of the third surface 122a. The flexible display 110 may be folded at the first peripheral portion 121c and the second peripheral portion 122c, or may be folded in an area adjacent to the first peripheral portion 121c and the second peripheral portion 122c.

The first printed circuit board 131 may be disposed between the second surface 121b of the first housing 121 and the first cover 161. The second printed circuit board 132 may be disposed between the fourth surface 122b of the second housing 122 and the second cover 162. Alternatively, the first printed circuit board 131 and the second printed circuit board 132 may be integrated into one printed circuit board and may be disposed between the second surface 121b of the first housing 121 and the first cover 161 or between the fourth surface 122b of the second housing 122 and the second cover 162. Various electronic components required to drive the electronic device 100 may be disposed on the first printed circuit board 131 and the second printed circuit board 132, such as a memory, at least one processor, communication circuitry, an antenna, a microphone, a speaker, at least one sensor and an electronic component associated with driving the sensor, or a camera.

The first battery 133 may be disposed between the second surface 121b of the first housing 121 and the first cover 161. The second battery 134 may be disposed between the fourth surface 122b of the second housing 122 and the second cover 162. The first battery 133 and the second battery 134 may supply power required to drive the electronic device 100 to such components as at least one of the first printed circuit board 131 and the second printed circuit board 132, the flexible display 110, and at least one sensor. Although a plurality of batteries 133 and 134 is illustrated, the disclosure is not limited thereto, and the electronic device 100 may include only one battery.

The hinge plates 141 and 142 may include the first hinge plate 141 coupled with the first housing 121 and one side of the hinge structure 200 and the second hinge plate 142 coupled with the second hinge housing 122 and an opposite side of the hinge structure 200. The first hinge plate 141 may be fixed, at one side thereof, to the edge of the first housing 121 that is adjacent to the second housing 122 and may be fixed, at an opposite side thereof, to part of the hinge structure 200. Accordingly, a force (or pressure) applied while a user folds or unfolds the first housing 121 or the second housing 122 may be transmitted to at least part of the hinge structure 200. For example, the second hinge plate 142 may be fixed, at one side thereof, to the edge of the second housing 122 that is adjacent to the first housing 121 and may be fixed, at an opposite side thereof, to the remaining part of the hinge structure 200. Accordingly, a force (or pressure) generated while the user folds or unfolds the first housing 121 or the second housing 122 may be transmitted to the remaining part of the hinge structure 200.

The hinge housing 150 may have a semi-cylindrical shape (or a container shape that has a semi-elliptical cross-section) and may have a structure that is closed at both ends. The hinge housing 150 may have an empty space therein in which one or more hinge structures 200 are mounted. The hinge housing 150 may be formed to have a length that corresponds to the length of the flexible display 110 in the direction of one axis thereof (e.g., a longitudinal axis) or the length of the first housing 121 in the longitudinal axis, and may have a semi-circular, semi-elliptical, or partially-curved cross-section.

The first cover 161 may be disposed on the rear surface of the first housing 121 to cover at least part of the second surface 121b of the first housing 121. The first cover 161 may be disposed to cover part of the hinge structure 200 (e.g., one side of the hinge housing 150) that is disposed between the first housing 121 and the second housing 122. The first cover 161 may have rounded corners, may have an empty space inside, and may be fastened to the second surface 121b of the first housing 121 to form an empty space between the first housing 121 and the first cover 161. For example, the first cover 161 may have a structure with a rectangular bottom surface and sidewalls formed on an upper side and left and right sides of the bottom surface.

The second cover 162 may be disposed adjacent to the first cover 161 and may be fastened to the fourth surface 122b of the second housing 122 to cover at least part of the second housing 122 (e.g., at least part of the fourth surface 122b). The second cover 162 may be disposed to cover the remaining part of the hinge structure 200 (e.g., an opposite side of the hinge housing 150) that is partially hidden by the first cover 161. The second cover 162 may have rounded corners, similar to the first cover 161, may have an empty space inside, and may be fastened to the fourth surface 122b of the second housing 122 to form an empty space between the second housing 122 and the second cover 162. In this regard, the second cover 162 may have a structure with a rectangular bottom surface and sidewalls formed on a lower side and left and right sides of the bottom surface.

Figure 3:
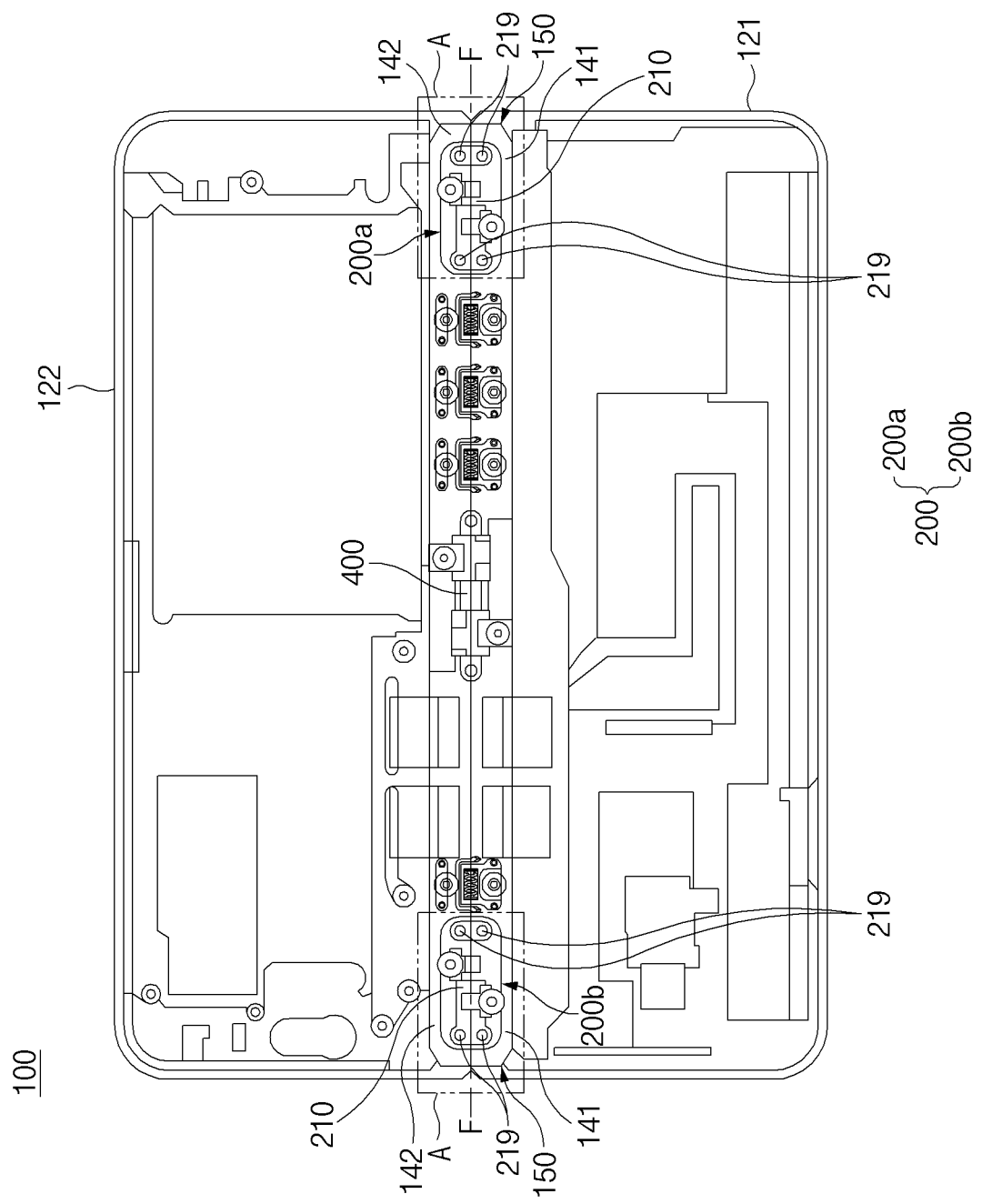
FIG. 3 illustrates an arrangement of a first housing, a second housing, and a hinge structure of the electronic device according to an embodiment.

FIG. 3 illustrates an arrangement of the first housing 121, the second housing 122, and the hinge structure 200 of the electronic device 100 according to an embodiment. FIG. 3 illustrates the electronic device 100 in a flat state from which the flexible display 110 is omitted.

Referring to FIG. 3, the electronic device 100 includes first hinge structures 200a and 200b and a second hinge structure 400 that are disposed in the hinge housing 150. The first hinge structures 200a and 200b may be disposed on opposite end portions of the hinge housing 150 in the direction of a folding axis F, respectively. The second hinge structure 400 may be disposed on a central area of the inside of the hinge housing 150 between the first hinge structures 200a and 200b, and may further include a gear structure for identically interlocking the rotation angles of the first housing 121 and the second housing 122. Hereinafter, the hinge structure 200 described herein may include the first hinge structures 200a and 200b of FIG. 3.

The electronic device 100 includes the first housing 121, the second housing 122, the hinge structure 200, the first hinge plate 141 connecting the hinge structure 200 and the first housing 121, and the second hinge plate 142 connecting the hinge structure 200 and the second housing 122.

The first housing 121 and the second housing 122 may be rotated about the folding axis F, which may be formed parallel to the central axis of the hinge structure 200.

The hinge structure 200 may include a fixed structure 210 fixedly disposed on the hinge housing 150.

The fixed structure 210 may include fixing holes 219 into which fastening members are inserted. The fixing holes 219 may include one or more openings. Referring to FIG. 3, two fixing holes 219 may be formed at positions that are symmetric to each other with respect to the folding axis F. The fastening members may be fastened to the hinge housing 150 through the fixing holes 219.

Figure 4:
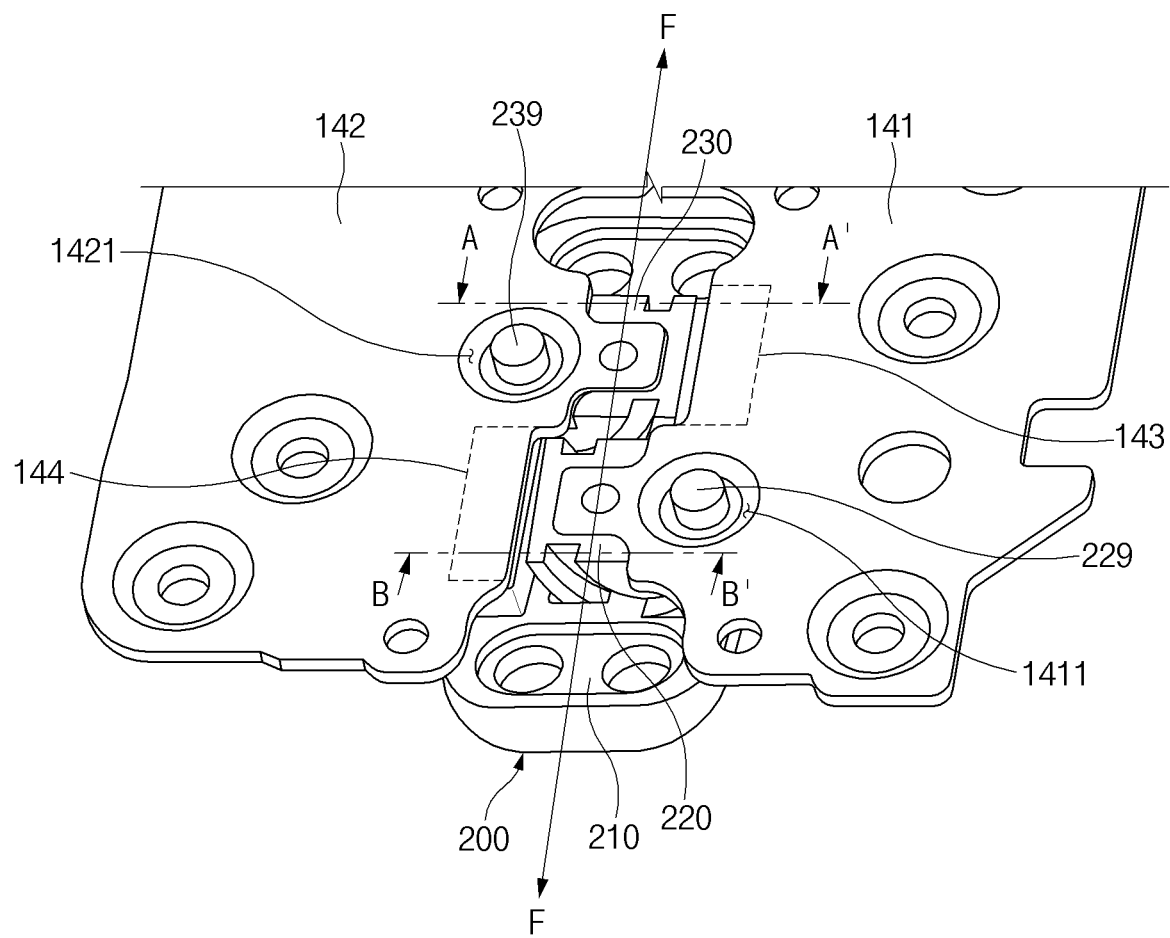
FIG. 4 illustrates a coupling of the hinge structure and hinge plates of the electronic device according to an embodiment.
Figure 4:
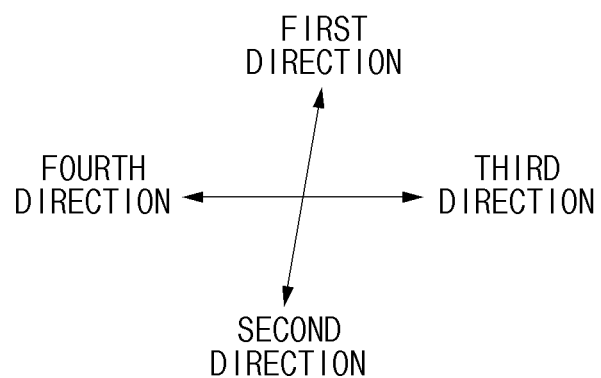

FIG. 4 illustrates a coupling of the hinge structure and the hinge plates of the electronic device according to an embodiment.

In FIG. 4, a first rotary structure 220 may be coupled to the fixed structure 210 so as to be rotatable relative to the fixed structure 210. The first rotary structure 220 may be spaced apart from a second rotary structure 230 in the direction of the folding axis F. The first rotary structure 220 may be connected to the first hinge plate 141. Accordingly, when the first hinge plate 141 rotates, the first rotary structure 220 may rotate together with the first hinge plate 141.

In FIG. 4, the second rotary structure 230 may be coupled to the fixed structure 210 so as to be rotatable relative to the fixed structure 210. The second rotary structure 230 may be spaced apart from the first rotary structure 220 in the direction of the folding axis F. The second rotary structure 230 may be connected to the second hinge plate 142. Accordingly, when the second hinge plate 142 rotates, the second rotary structure 230 may rotate together with the second hinge plate 142.

The first hinge plate 141 may include a fastening hole 1411 for connection with the first rotary structure 220. A first fastening protrusion 229 formed on the first rotary structure 220 may be inserted into the first fastening hole 1411. The first fastening protrusion 229 may include or be formed of a rivet. For example, the first rotary structure 220 and the first hinge plate 141 may be coupled together by deforming the protruding portion of the first fastening protrusion 229, which is inserted into the first fastening hole 1411, by applying an impact to the protruding portion. However, without being limited thereto, the coupling structure of the first hinge plate 141 and the first rotary structure 220 may include various coupling structures.

The second hinge plate 142 includes a second fastening hole 1421 for connection with the second rotary structure 230. A second fastening protrusion 239 formed on the second rotary structure 230 may be inserted into the second fastening hole 1421. The second fastening protrusion 239 may include or be formed of a rivet. For example, the second rotary structure 230 and the second hinge plate 142 may be coupled together by deforming the protruding portion of the second fastening protrusion 239, which is inserted into the second fastening hole 1421, by applying an impact to the protruding portion. However, without being limited thereto, the coupling structure of the second hinge plate 142 and the second rotary structure 230 may include various coupling structures.

The first hinge plate 141 may be connected with the first housing 121 and the first rotary structure 220. Accordingly, the first hinge plate 141, together with the first housing 121, may rotate about the folding axis F when the first rotary structure 220 rotates about the folding axis F. The first hinge plate 141 may include a first guide area 143 that is disposed to overlap the fixed structure 210. The first guide area 143 may be supported by the fixed structure 210, and may restrict the range of rotation of the first housing 121 when the first rotary structure 220 rotates from a folded state to a flat state. The first guide area 143 may guide the range of rotation of the first hinge plate 141 such that the angle between the first hinge plate 141 and the second hinge plate 142 does not exceed 180 degrees.

The second hinge plate 142 may be connected with the second housing 122 and the second rotary structure 230. The second hinge plate 142, together with second first housing 122, may rotate about the folding axis F when the second rotary structure 230 rotates about the folding axis F. The second hinge plate 142 may include a second guide area 144 that is disposed to overlap the fixed structure 210. The second guide area 144 may be supported by the fixed structure 210, and may restrict the range of rotation of the second housing 122 when the second rotary structure 230 rotates from a folded state to a flat state. The second guide area 144 may guide the range of rotation of the second hinge plate 142 such that the angle between the second hinge plate 142 and the first hinge plate 141 does not exceed 180 degrees.

Figure 5A:
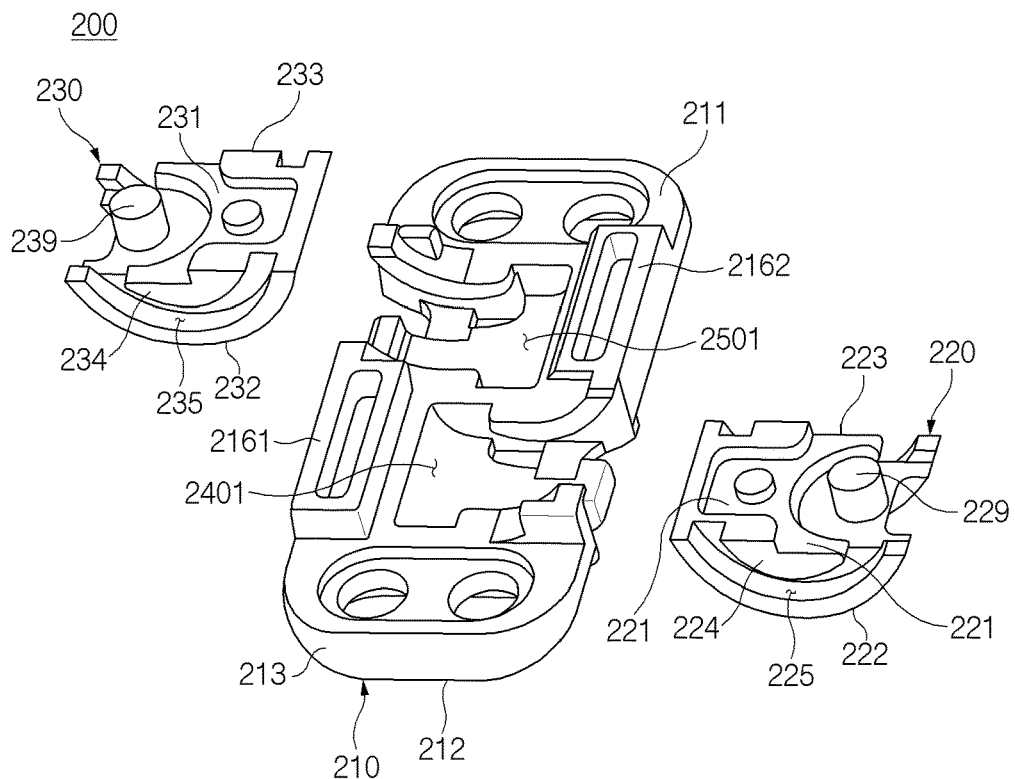
FIGS. 5A and 5B are exploded perspective views of the hinge structure according to an embodiment.
Figure 5B:
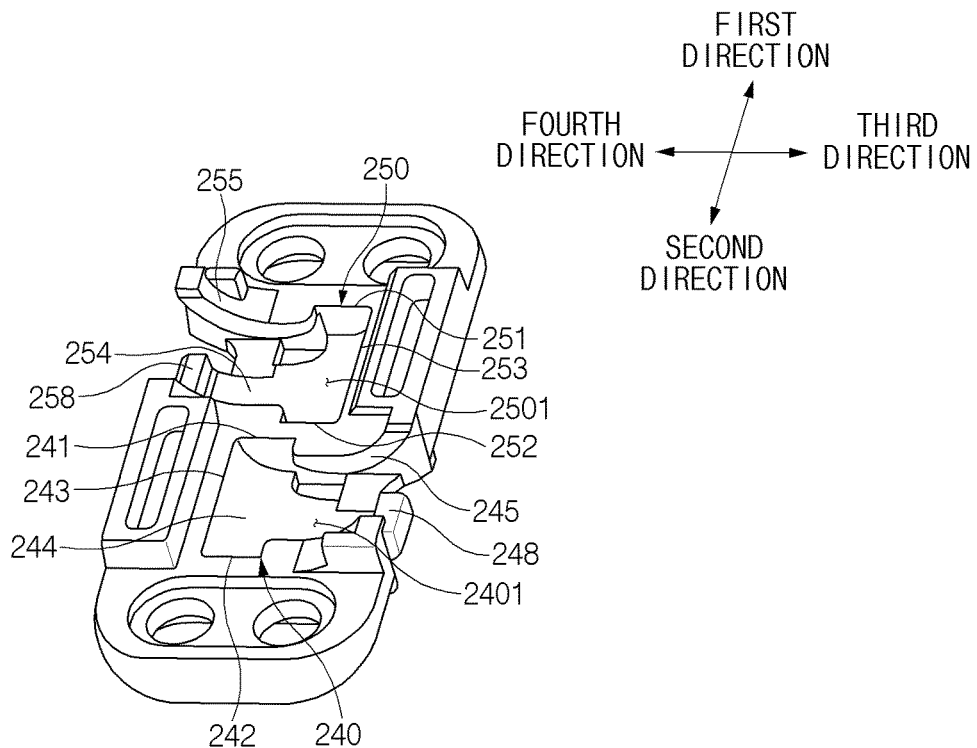

FIGS. 5A and 5B are exploded perspective views of the hinge structure according to an embodiment.

The hinge structure 200 may include the fixed structure 210, the first rotary structure 220 and the second rotary structure 230 that are coupled to the fixed structure 210 so as to be rotatable.

The fixed structure 210 may include a front surface 211, a rear surface 212 opposite to the front surface 211, and a side surface 213 formed between the front surface 211 and the rear surface 212. The fixed structure 210 may include a first recess 2401 and a second recess 2501 that are concavely formed on the front surface 211 in the direction toward the rear surface 212. The first rotary structure 220 may be disposed in the first recess 2401, and the second rotary structure 230 may be disposed in the second recess 2501. The first recess 2401 and the second recess 2501 may be formed in positions spaced apart from each other in a first direction and a second direction.

The fixed structure 210 may include a first support area 2161 and a second support area 2162 that restrict the ranges of rotation of a first hinge plate and a second hinge plate. The second support area 2162 may be formed adjacent to the second recess 2501 and may be spaced apart from the first recess 2401 in the first direction. The first support area 2161 may be formed adjacent to the first recess 2401 and may be spaced apart from the second recess 2501 in the second direction. The first support area 2161 and the second support area 2162 may have a shape that protrudes from the front surface 211 of the fixed structure 210.

In a flat state of the electronic device 100, the first support area 2161 may support a second guide area of the second hinge plate, thereby preventing the second hinge plate from being unfolded by more than a specified angle. In the flat state of the electronic device 100, the second support area 2162 may support a first guide area of the first hinge plate, thereby preventing the first hinge plate from being unfolded by more than the specified angle. Here, the specified angle may be an angle at which the first hinge plate or the second hinge plate faces substantially the same direction as the front surface 211 of the fixed structure 210. To this end, the first support area 2161 may protrude by the height by which the second hinge plate is spaced apart from the front surface 211 of the fixed structure 210 in the flat state. To this end, the second support area 2162 may protrude by the height by which the first hinge plate is spaced apart from the front surface 211 of the fixed structure 210 in the flat state.

The fixed structure 210 may include a first recess structure 240 that forms the first recess 2401 and a second recess structure 250 that forms the second recess 2501.

The first recess structure 240 may include a plurality of inner walls 241, 242, and 243 that surround at least part of the first recess 2401. The first recess 2401 may be formed in a shape that is open in one direction that is perpendicular to the first direction and the second direction. For example, the first recess 2401 may be open in a third direction. The first recess 2401 may be formed in a shape that is closed to the inside of the fixed structure 210 and is open to the outside of the fixed structure 210. That is, the first recess 2401 may be open through part of the side surface 213 of the fixed structure 210.

The first recess structure 240 includes a first bottom surface 244 that extends from the first inner wall 241, the second inner wall 242, and the third inner wall 243.

In FIG. 5B, the first inner wall 241 may be formed to face the first direction and to be opposite the second inner wall 242. The second inner wall 242 may be formed to face the second direction so as to be opposite the first inner wall 241. The first rotary structure 220 may be disposed between the first inner wall 241 and the second inner wall 242. The first inner wall 241 and the second inner wall 242 may each include a first guide structure 245 protruding toward the first recess 2401. At least part of the first guide structure 245 may be received in a first guide rail 225 formed on the first rotary structure 220. The third inner wall 243 may be formed to face the third direction that is perpendicular to the first direction and the second direction, may be located on one side of the first support area 2161 in the third direction, and may face the open side of the first recess 2401.

The first bottom surface 244 may extend from at least a part of the first inner wall 241, the second inner wall 242, and the third inner wall 243. At least part of the first bottom surface 244 may be formed in a direction toward the front surface 211 of the fixed structure 210. At least part of the first bottom surface 244 may be formed of a curved surface corresponding to a second surface 222 of the first rotary structure 220. The first bottom surface 244 may include a first stopper 248 formed in an area that substantially extends from the curved surface in the third direction. The first stopper 248 may restrict the range of rotation of the first rotary structure 220, and may protrude from the first bottom surface 244 toward the front surface 211 of the fixed structure 210 so as to be included within the radius of rotation of the first rotary structure 220.

In FIG. 5B, the second recess structure 250 includes a plurality of inner walls 251, 252, and 253 that surround at least part of the second recess 2501. The second recess 2501 may be formed in a shape that is open in an opposite (fourth) direction that is perpendicular to the first direction and the second direction. The second recess 2501 may be formed in a shape that is closed to the inside of the fixed structure 210 and is open to the outside of the fixed structure 210. That is, the second recess 2501 may be open through part of the side surface 213 of the fixed structure 210.

In FIG. 5B, the second recess structure 250 includes a second bottom surface 254 that extends from the fourth inner wall 251, the fifth inner wall 252, and the sixth inner wall 253.

In FIG. 5B, the fourth inner wall 251 may be formed to face the first direction and to be opposite the fifth inner wall 252. The fifth inner wall 252 may be formed to face the second direction so as to be opposite the fourth inner wall 251. The second rotary structure 230 may be disposed between the fourth inner wall 251 and the fifth inner wall 252. The fourth inner wall 251 and the fifth inner wall 252 may each include a second guide structure 255 protruding toward the second recess 2501. At least part of the second guide structure 255 may be received in a second guide rail 235 formed on the second rotary structure 230.

The sixth inner wall 253 may be formed to face the fourth direction that is perpendicular to the first direction and the second direction and is opposite to the third direction. The sixth inner wall 253 may be located on one side of the second support area 2162 in the fourth direction, and may face the open side of the second recess 2501. The second bottom surface 254 may extend from at least a part of the fourth inner wall 251, the fifth inner wall 252, and the sixth inner wall 253. At least part of the second bottom surface 254 may be formed in a direction toward the front surface 211 of the fixed to structure 210. At least part of the second bottom surface 254 may be formed of a curved surface that extends from the sixth inner wall 253 and corresponds to a second surface 232 of the second rotary structure 230. The second bottom surface 254 may include a second stopper 258 formed in an area that substantially extends from the curved area in the fourth direction. The second stopper 258 may restrict the range of rotation of the second rotary structure 230, and may protrude from the second bottom surface 254 toward the front surface 211 of the fixed structure 210 so as to be included within the radius of rotation of the second rotary structure 230.

In FIG. 5A, the first rotary structure 220 may be formed in a substantially semi-circular shape and may be spaced apart from the second rotary structure 230 in the second direction. The first rotary structure 220 may include a first surface 221 on which the first fastening protrusion 229 for connection with the first hinge plate is formed, the second surface 222 that is opposite to the first surface 221 and that is formed of a circular arc surface, a first side surface 223 facing the first direction, and a second side surface 224 facing the second direction. In a flat state, the first surface 221 of the first rotary structure 220 may face substantially the same direction as the front surface 211 of the fixed structure 210.

In a folded state, the first surface 221 of the first rotary structure 220 may substantially face the third inner wall 243 in the fourth direction. At least part of the second surface 222 of the first rotary structure 220 may be supported by the first bottom surface 244. The second surface 222 of the first rotary structure 220 may include a curved surface having a curvature corresponding to the curved surface included in the first bottom surface 244. The first rotary structure 220 may be disposed in the first recess 2401 such that the first side surface 223 faces the first inner wall 241 and the second side surface 224 faces the second inner wall 242. The first rotary structure 220 may include, on the first side surface 223 and the second side surface 224, the first guide rails 225 for receiving at least parts of the first guide structures 245 that are formed on the first inner wall 241 and the second inner wall 242 of the fixed structure 210.

In FIG. 5A, the second rotary structure 230 may be formed in a substantially semi-circular shape. The second rotary structure 230 may be spaced apart from the first rotary structure 220 in the first direction. The second rotary structure 230 may include a first surface 231 on which the second fastening protrusion 239 for connection with the second hinge plate is formed, the second surface 232 that is opposite to the first surface 231 and that is formed of a circular arc surface, a first side surface 233 facing the first direction, and a second side surface 234 facing the second direction. In the flat state, the first surface 231 of the second rotary structure 230 may face substantially the same direction as the front surface 211 of the fixed structure 210.

In the folded state, the first surface 231 of the second rotary structure 230 may substantially face the sixth inner wall 253 in the third direction. At least part of the second surface 232 of the second rotary structure 230 may be supported by the second bottom surface 254. The second surface 232 of the second rotary structure 230 may include a curved surface having a curvature corresponding to the curved surface included in the second bottom surface 254. The second rotary structure 230 may be disposed in the second recess 2501 such that the first side surface 233 faces the fourth inner wall 251 and the second side surface 234 faces the fifth inner wall 252. The second rotary structure 230 may include, on the first side surface 233 and the second side surface 234, the second guide rails 235 for receiving at least parts of the second guide structures 255 that are formed on the fourth inner wall 251 and the fifth inner wall 252 of the fixed structure 210.

Figure 6A:
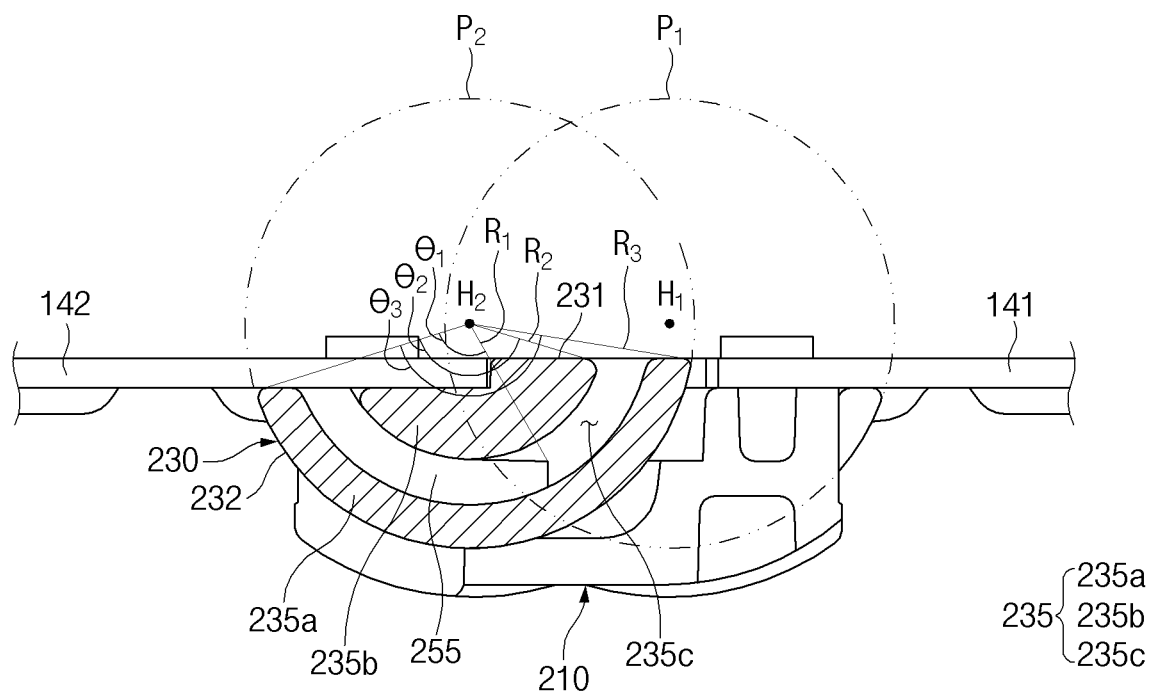
FIGS. 6A and 6B are sectional views illustrating virtual axes of rotation of the hinge structure according to an embodiment.
Figure 6B:
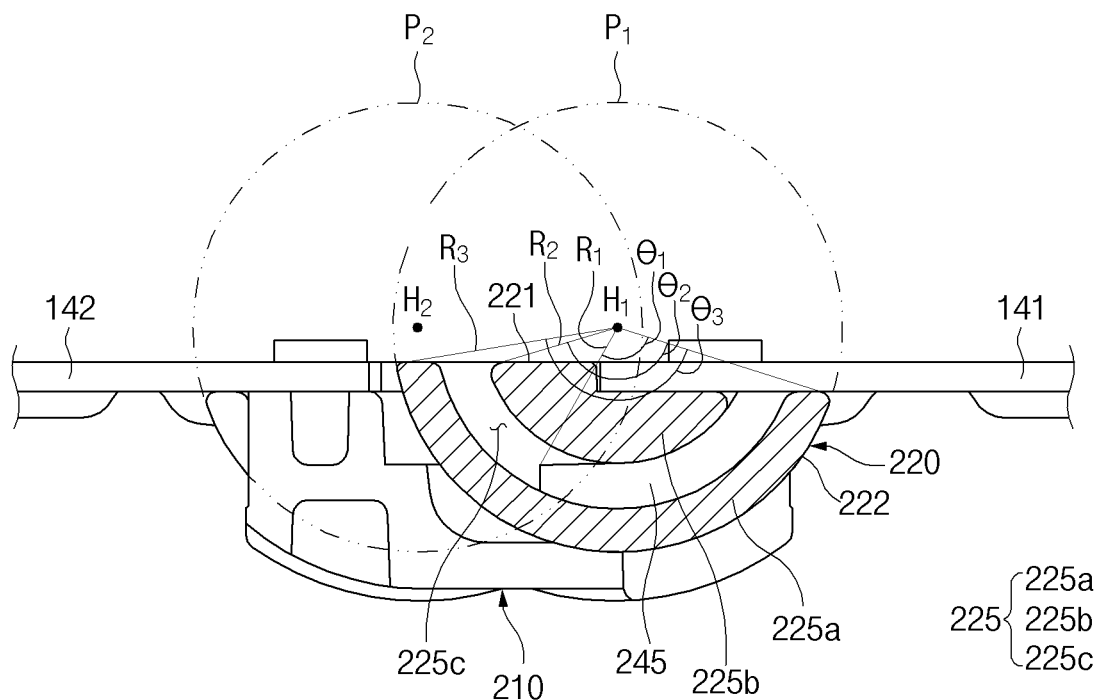

FIGS. 6A and 6B are sectional views illustrating virtual axes of rotation of the hinge structure 200 according to an embodiment. FIG. 6A is a sectional view taken along line A-A' of FIG. 4. FIG. 6B is a sectional view taken along line B-B' of FIG. 4.

In FIGS. 6A and 6B, the hinge structure 200 includes the fixed structure 210, the first rotary structure 220 and the second rotary structure 230 that are coupled to the fixed structure 210 so as to be rotatable, the first hinge plate 141 connected to the first rotary structure 220, and the second hinge plate 142 connected to the second rotary structure 230.

The first rotary structure 220 may rotate along a first path P1 having a first virtual axis of rotation H1 as the center. The first path P1 may be a path along which the second surface 222 of the first rotary structure 220 passes. The first rotary structure 220 may rotate in the opposite direction to the rotational direction of the second rotary structure 230.

The second rotary structure 230 may rotate along a second path P2 having a second virtual axis of rotation H2 as the center. The second path P2 may be a path along which the second surface 232 of the second rotary structure 230 passes. The second rotary structure 230 may rotate in the opposite direction to the rotational direction of the first rotary structure 230.

In FIG. 6B, the fixed structure 210 may include the first guide structures 245 protruding toward the first rotary structure 220. The first guide structures 245 may be formed in a circular arc shape having the first virtual axis of rotation H1 as the center. The first guide structures 245 may be received in the first guide rails 225 formed on the first rotary structure 220. The first guide structures 245 may be formed between first guide portions 225a and second guide portions 225b of the first guide rails 225.

Each of the first guide structures 245 may be formed such that a first angle of arc θ1 with the first virtual axis of rotation H1 as the center thereof is smaller than a third angle of arc θ3 of the first guide portion 225a with the first virtual axis of rotation H1 as the center thereof and a second angle of arc θ2 of the second guide portion 225b with the first virtual axis of rotation H1 as the center thereof. For example, the first guide structure 245 may have a first radius of curvature R1 from the first virtual axis of rotation H1 and may extend by the first angle θ1 in the circumferential direction. The second guide portion 225b may have a second radius of curvature R2 smaller than the first radius of curvature R1 and may extend by the second angle θ2 larger than the first angle θ1 in the circumferential direction. The first guide portion 225a may have a third radius of curvature R3 larger than the first radius of curvature R1 and may extend by the third angle θ3 larger than the first angle θ1 in the circumferential direction. That is, the first guide structures 245 may extend a shorter distance in the circumferential direction with respect to the first virtual axis of rotation H1 than the first guide rails 225. Accordingly, the first guide rails 225 may include non-contact areas 225c that do not make contact with the first guide structures 245 in a flat state and a folded state.

In FIG. 6A, the fixed structure 210 includes the second guide structures 255 protruding toward the second rotary structure 230. The second guide structures 255 may be formed in a circular arc shape with the second virtual axis of rotation H2 as the center thereof. The second guide structures 255 may be received in the second guide rails 235 formed on the second rotary structure 230. The second guide structures 255 may be formed between third guide portions 235a and fourth guide portions 235b of the second guide rails 235. Each of the second guide structures 255 may be formed such that a first angle of arc θ1 with the second virtual axis of rotation H2 as the center thereof is smaller than a third angle of arc θ3 of the third guide portion 235a with the second virtual axis of rotation H2 as the center thereof and a second angle of arc θ2 of the fourth guide portion 235b with the second virtual axis of rotation H2 as the center thereof.

For example, the second guide structure 255 may have a first radius of curvature R1 from the second virtual axis of rotation H2 and may extend by the first angle θ1 in the circumferential direction. The third guide portion 235a may have a third radius of curvature R3 larger than the first radius of curvature R1 and may extend by the third angle θ3 larger than the first angle θ1 in the circumferential direction. The fourth guide portion 235b may have a second radius of curvature R2 smaller than the first radius of curvature R1 and may extend by the second angle θ2 larger than the first angle θ1 in the circumferential direction. That is, the second guide structures 255 may extend a shorter distance in the circumferential direction with respect to the second virtual axis of rotation H2 than the second guide rails 235. Accordingly, the second guide rails 235 may include non-contact areas 235c that do not make contact with the second guide structures 255 in the flat state and the folded state.

Figure 7:
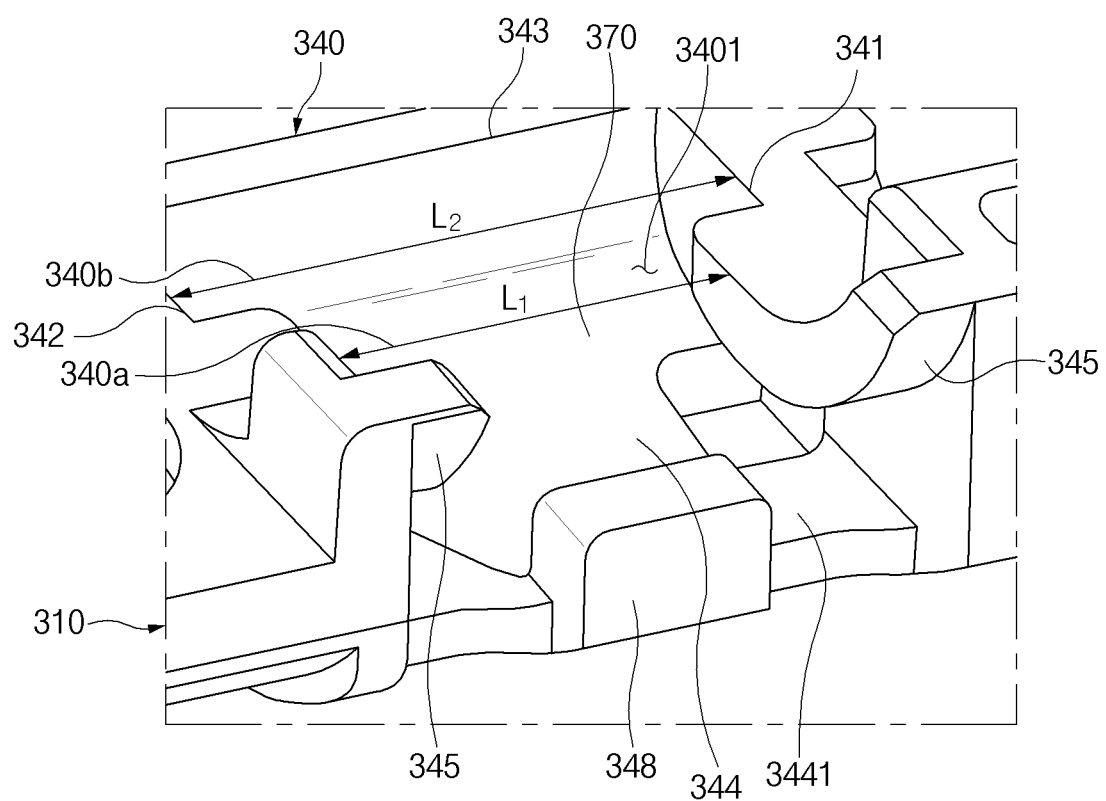
FIG. 7 illustrates a recess structure of a fixed structure of the hinge structure according to an embodiment.

FIG. 7 illustrates a recess structure of a fixed structure of the hinge structure according to an embodiment.

In the illustrated embodiment, the recess structure 340 may include a first inner wall 341, a second inner wall 342, a third inner wall 343, a bottom surface 344, and a stopper 348 that protrudes from the bottom surface 344. The first inner wall 341 and the second inner wall 342 may face the axial direction while facing each other. The first inner wall 341 and the second inner wall 342 may each include a guide structure 345 protruding toward a recess 3401.

When viewed in a direction perpendicular to the axial direction toward the inside of the fixed structure 310 from the outside, the first inner wall 341 and the second inner wall 342 may each include a first portion 340a on which the guide structure 345 is formed and a second portion 340b on which the guide structure 345 is not formed. In another example, the recess 3401 may include the first portion 340a formed to have a first length L1 in the axial direction and the second portion 340b formed to have a second length L2 greater than the first length L1 in the axial direction.

At least part of the third inner wall 343 may be formed of a curved surface having a radius of curvature corresponding to the radius of curvature of a rotary structure to support rotation of the rotary structure. The third inner wall 343 and part of the bottom surface 344 may be formed of one continuous curved surface. The bottom surface 344 may include a curved surface 370 extending from the curved surface of the third inner wall 343. The bottom surface 344 may include an extension area 3441 that extends toward the outside of the fixed structure 310 (e.g., in the direction in which the recess 3401 is open) and on which the protruding stopper 348 is formed.

At least part of the stopper 348 may protrude toward a front surface 311 of the fixed structure 310 so as to be included within the radius of rotation of the rotary structure.

Figure 8A:
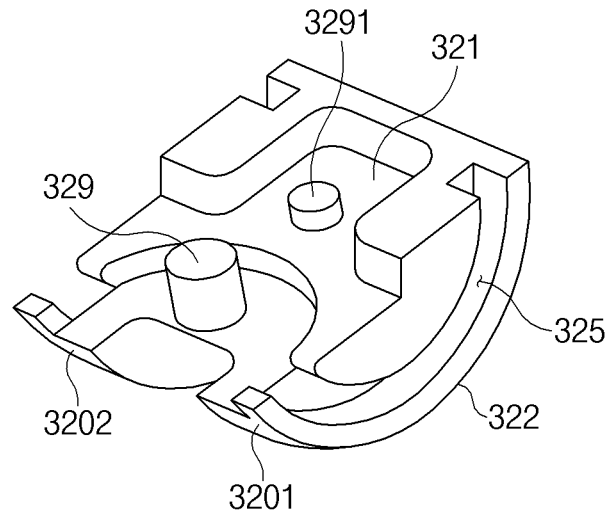
FIGS. 8A and 8B illustrate a rotary structure of the hinge structure according to an embodiment.
Figure 8B:
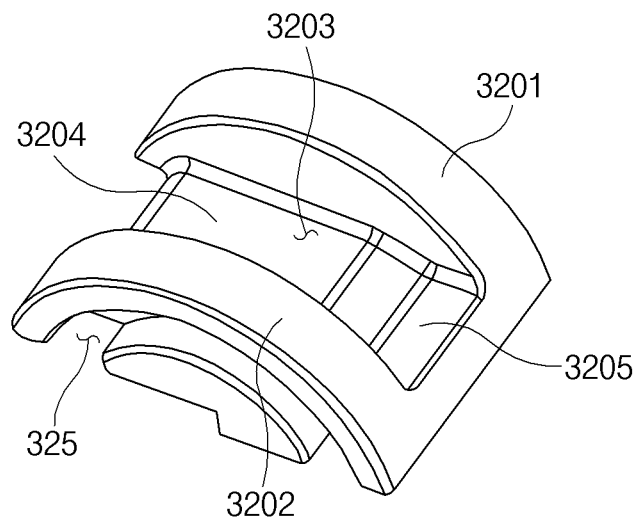

FIGS. 8A and 8B illustrate a rotary structure of the hinge structure according to an embodiment.

In FIGS. 8A and 8B, the rotary structure 320 includes a first support portion 3201 including a first side surface on which a guide rail 325 is formed, a second support portion 3202 including a second side surface on which a guide rail 325 is formed, and a receiving groove 3203 formed between the first support portion 3201 and the second support portion 3202.

In FIGS. 8A and 8B, the first support portion 3201 may be formed in a semi-circular shape and may face a first inner wall of the recess structure 340. A second surface 322 included in the first support portion 3201 may substantially form part of the guide rail 325. At least part of the second surface 322 included in the first support portion 3201 may be supported by the bottom surface 344 of the recess structure 340.

In FIGS. 8A and 8B, the second support portion 3202 may be formed in a semi-circular shape. The second support portion 3202 may face a second inner wall of the recess structure 340. The second surface 322 included in the second support portion 3202 may substantially form part of the guide rail 325. At least part of the second surface 322 included in the second support portion 3202 may be supported by the bottom surface 344 of the recess structure 340.

In FIG. 8B, the receiving groove 3203 may be formed between the first support portion 3201 and the second support portion 3202, and the stopper 348 may be received in the receiving groove 3203. A bottom surface 3204 of the receiving groove 3203 may be formed of a substantially flat surface. The receiving groove 3203 may include a contact area 3205 formed on an inner end portion of the bottom surface 3204. The contact area 3205 may be concavely formed toward a first surface 321 from the bottom surface 3204 of the receiving groove 3203. The receiving groove 3203 may extend to the outside edge of the first surface 321 and may be formed in a shape that is open to the outside of a fixed structure and is closed to the inside of the fixed structure.

The rotary structure 320 may be disposed such that the contact area 3205 formed on the bottom surface 3204 is located inward of a fastening protrusion 329 in a flat state.

Referring to FIGS. 8A and 8B, the rotary structure 320 may further include an additional protrusion 3291 adjacent to the fastening protrusion 329. The additional protrusion 3291 may be inserted into an opening that is formed in a hinge plate. The additional protrusion 3291 may temporarily fix the position of the hinge plate such that the fastening protrusion 329 and a fastening hole of the hinge plate that corresponds to the fastening hole 329 are aligned with each other.

Figure 9A:
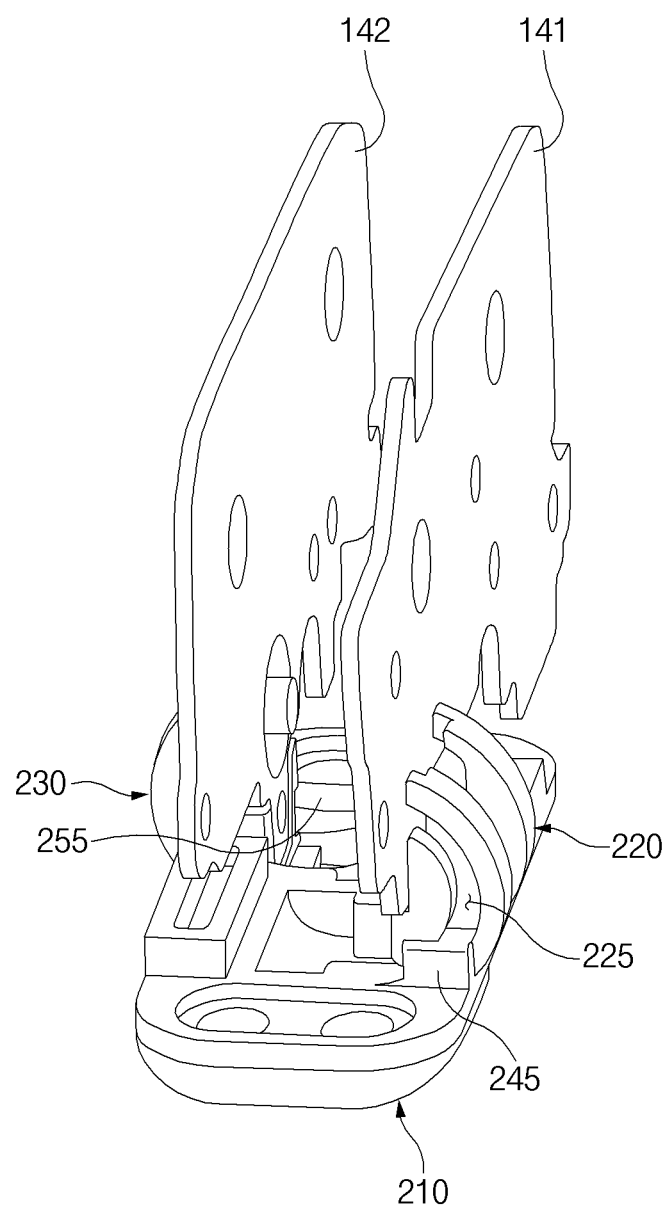
FIGS. 9A and 9B illustrate a folded state of the hinge structure according to an embodiment.
Figure 9B:
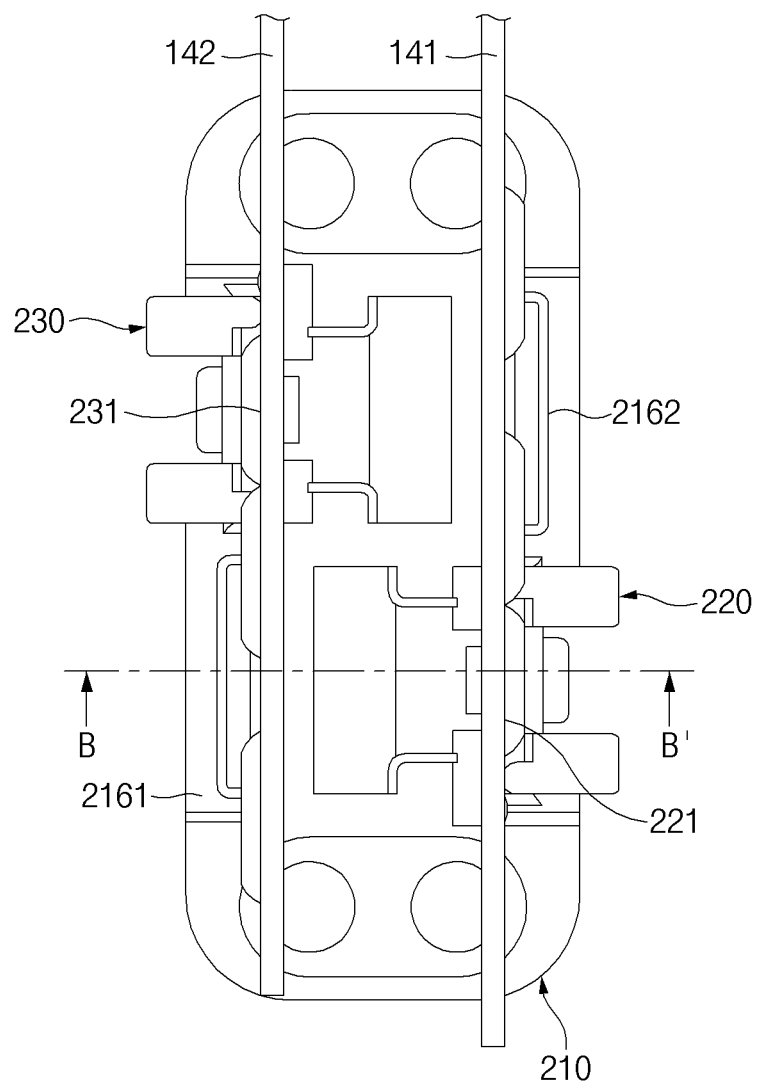

FIGS. 9A and 9B illustrate a folded state of the hinge structure according to an embodiment. FIG. 9A is a perspective view illustrating the folded state of the hinge structure, and FIG. 9B is a plan view illustrating the folded state of the hinge structure.

In FIGS. 9A and 9B, the fixed structure 210 includes the first support area 2161 and the second support area 2162 on the front surface thereof. The first support area 2161 may be formed to support at least part of the second hinge plate 142 and may prevent the second hinge plate 142 from being unfolded by more than a specified angle corresponding to a flat state. The second support area 2162 may be formed to support at least part of the first hinge plate 141 and may prevent the first hinge plate 141 from being unfolded by more than the specified angle corresponding to the flat state.

In FIG. 9A, the guide structures 245 included in the fixed structure 210 may be received in the guide rails 225 included in the first rotary structure 220 to guide rotation of the first rotary structure 220. The first rotary structure 220 may rotate in the opposite direction to the rotational direction of the second rotary structure 230. The first surface 221 of the first rotary structure 220 may face the first surface 231 of the second rotary structure 230. The first hinge plate 141 connected to the first hinge structure 220 and the second hinge plate 142 connected to the second rotary structure 230 may face each other.

Figure 10A:
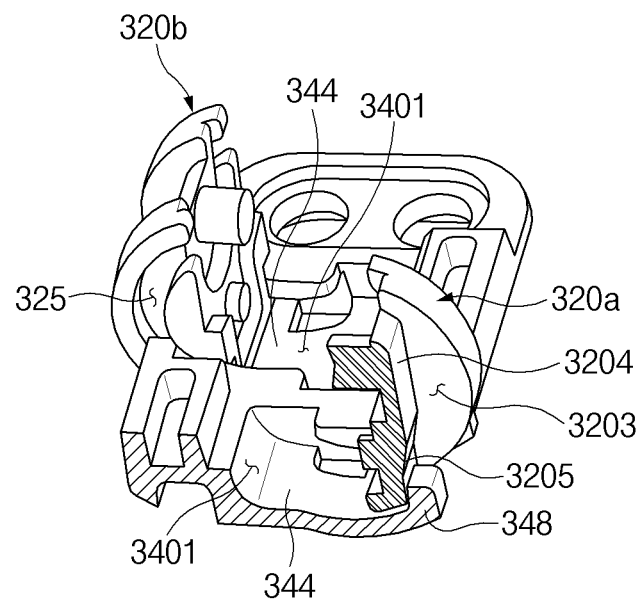
FIGS. 10A and 10B illustrate a state in which the range of rotation of the rotary structure is restricted by a stopper in a folded state of the hinge structure according to an embodiment.
Figure 10B:
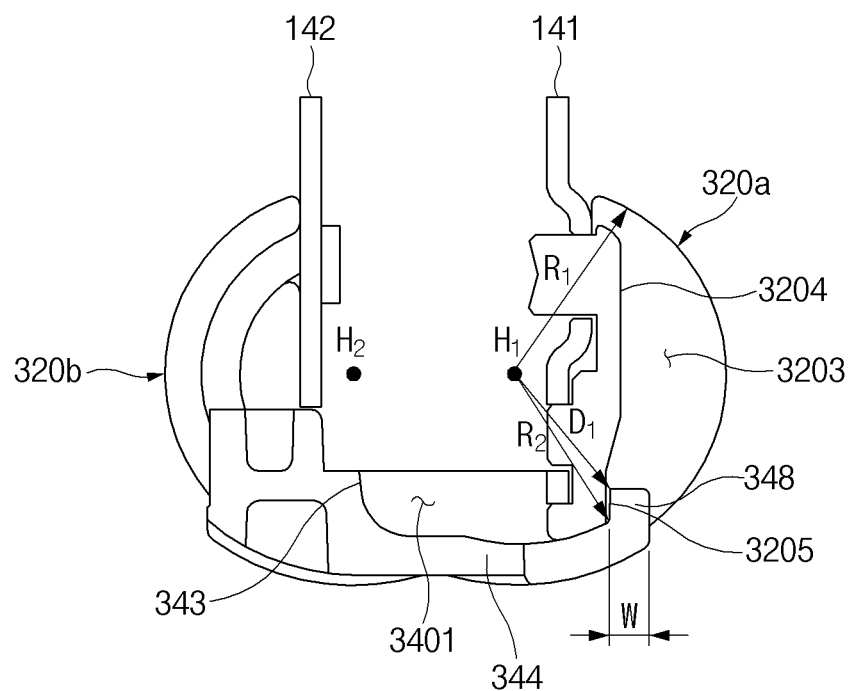

FIGS. 10A and 10B illustrate a state in which the range of rotation of the rotary structure 320 is restricted by the stopper 348 in a folded state of the hinge structure according to an embodiment. FIG. 10A is a sectional perspective view taken along line B-B' of FIG. 9B, and FIG. 10B is a sectional view taken along line B-B' of FIG. 9B.

The folded state may be when the first surface 321 of the rotary structure 320 faces a direction perpendicular to a virtual axis of rotation. Alternatively, the folded state may be when the first surface 321 of a first rotary structure 320a (or the first hinge plate 141) faces the first surface 321 of a second rotary structure 320b (or the second hinge plate 142).

The fixed structure 310 includes the recesses 3401 that are open toward the outside of the fixed structure 310. The stoppers 348, which protrude toward the front surface 311 of the fixed structure 310, may be formed on the bottom surfaces 344 of the recesses 3401. The stoppers 348 may be disposed in the receiving grooves 3203, which are formed on the rotary structures 320a and 320b, when the rotary structures 320a and 320b are rotated about the virtual axes of rotation H1 and H2 within a predetermined angle range. The stoppers 348 may be brought into contact with the bottom surfaces 3204 of the receiving grooves 3203, which are formed on the rotary structures 320a and 320b, when the rotation angles of the rotary structures 320a and 320b reach a specified stop angle.

The stoppers 348 may be formed such that at least parts of the stoppers 348 are closer to the virtual axes of rotation H1 and H2 than the maximum radii of rotation formed by the second surfaces 322 of the rotary structures 320a and 320b. For example, the radius of rotation R1 of the second surface 322 of the first rotary structure 320a with respect to the first virtual axis of rotation H1 may be greater than the distance D1 from the first virtual axis of rotation H1 to a portion of the stopper 348.

The stoppers 348 may be formed such that at least parts of the stoppers 348 are closer to the virtual axes of rotation H1 and H2 than the maximum radii of rotation of the bottom surfaces 3204 of the receiving grooves 3203. For example, the maximum radius of rotation of the bottom surface 3204 of the receiving groove 3203, which is formed on the first rotary structure 320a, may be the distance R2 from an end portion adjacent to the bottom surface 344 of the recess 3401 to the first virtual axis of rotation H1 in the folded state and may be greater than the distance D1 from the first virtual axis of rotation H1 to the portion of the stopper 348.

The stoppers 348 may protrude from the bottom surfaces 344 of the recesses 3401 such that at least parts of the stoppers 348 are included within the maximum radii of rotation of the rotary structures 320a and 320b. Accordingly, when the rotary structures 320a and 320b are rotated within a predetermined angle range between a folded state and a flat state, the stoppers 348 may not be brought into contact with the rotary structures 320a and 320b, such as contact areas 3205 of the bottom surfaces 3204, and when the rotary structures 320a and 320b are rotated through a specified and reach a folded state, the stoppers 348 may be brought into contact with contact areas 3205 of the bottom surfaces 3204 of the rotary structures 320a and 320b to stop the rotation of the rotary structures 320a and 320b.

The contact areas 3205 of the receiving grooves 3203 may be concavely formed toward the first surfaces 321 of the rotary structures 320a and 320b, compared to the remaining areas of the bottom surfaces 3204, which may be related to the thickness of the stoppers 348 based on the length w from the inside to the outside of the rotary structures 320a and 320b. The contact areas 3205 may be formed such that the rotary structures 320a and 320b form a specified angle (e.g., a folded state) when the contact areas 3205 are brought into contact with the stoppers 348.

In FIGS. 10A and 10B, the rotary structures 320a and 320b may be disposed in the recesses 3401 formed on the fixed structure 310. The rotary structures 320a and 320b may rotate along the guide structures 245 and 255, which are formed in the fixed structure 310, such that the inner portions of the rotary structures 320a and 320b move to the outer portions of the fixed structure 310 in the folded state. At this time, the stoppers 348 may be brought into contact with the bottom surfaces 3204 of the receiving grooves 3203 of the rotary structures 320a and 320b.

The fixed structure 310 may include the first support area 2161 and the second support area 2162 that support the hinge plates 141 and 142 in a flat state to prevent the rotary structures 320a and 320b from being additionally unfolded (i.e., from forming an angle of 180 degrees or more) in the flat state when the angle between the first hinge plate 141 and the second hinge plate 142 is 180 degrees.

Figure 11A:
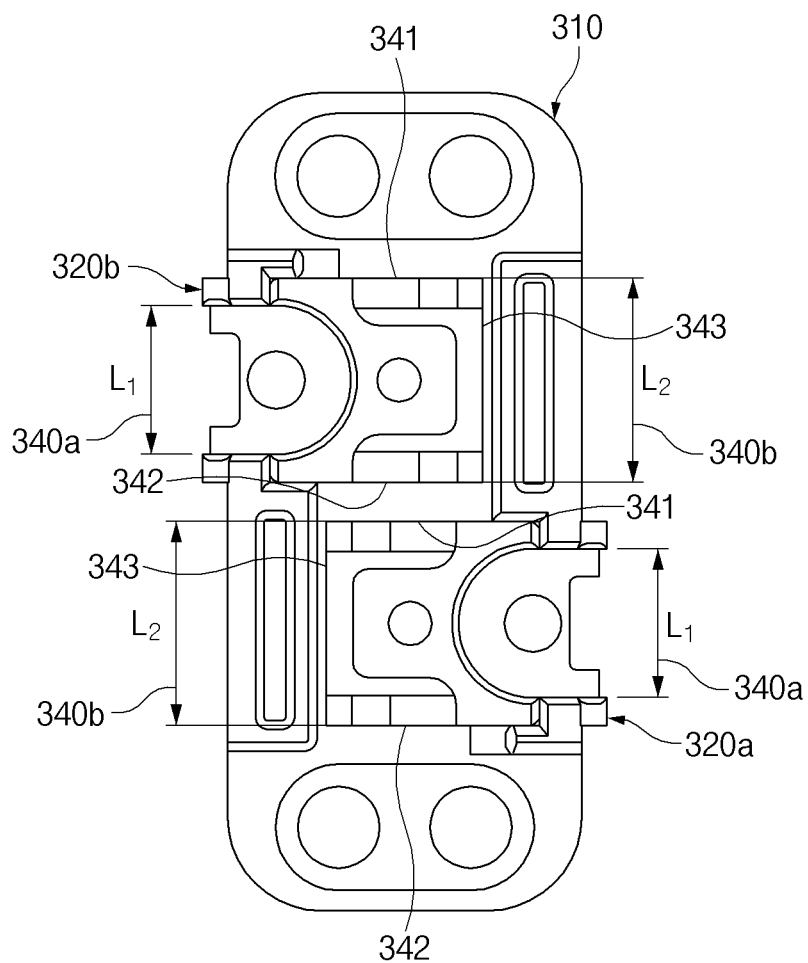
FIGS. 11A and 11B illustrate a method of assembling the recess structure of the fixed structure and the rotary structure in the hinge structure according to an embodiment.
Figure 11B:
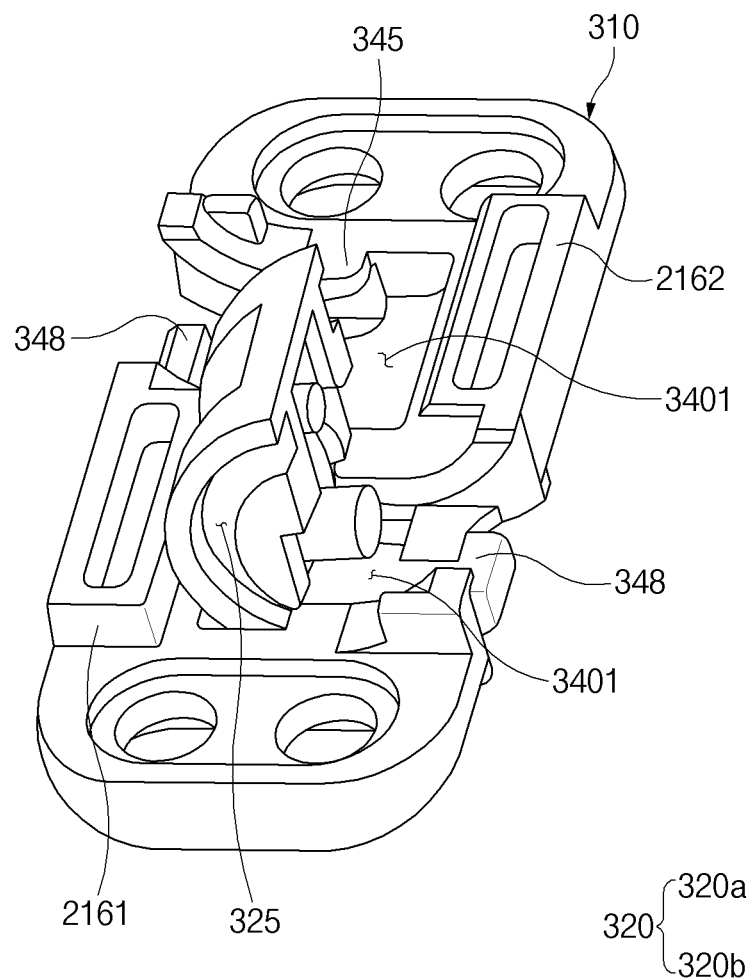

FIGS. 11A and 11B illustrate a method of assembling the recess structure of the fixed structure and the rotary structure in the hinge structure according to an embodiment.

Hereinafter, a direction in which the rotary structure 320 rotates from a flat state to a folded state is referred to as a first rotational direction, and a direction opposite to the first rotational direction is referred to as a second rotational direction.

Referring to FIG. 11A, each of the recesses 3401, when viewed from above, may include the first portion 340a extending by the first length L1 in the axial direction and the second portion 340b extending by the second length L2 greater than the first length L1 in the axial direction. The first portion 340a may be located outward of the second portion 340b.

In FIG. 11A, the first portion 340a includes the open side of the recess 3401. The second portion 340b may be formed by the third inner wall 343 and portions of the first inner wall 341 and the second inner wall 342. The second portion 340b may include the areas of the first inner wall 341 and the second inner wall 342 in which the guide structures 345 are not formed. The first portion 340a may be formed by the guide structures 345 that are formed on the first inner wall 341 and the second inner wall 342, respectively. The recess 3401 may have a structure in which the outside is open and the inside is larger than the outside in the axial direction.

Referring to FIG. 11B, the rotary structure 320 may be coupled to the fixed structure 310 so as to be rotatable, by inserting the outside of the rotary structure 320 into the recess 3401 of the fixed structure 310 and moving the outside of the rotary structure 320 to the outside of the fixed structure 310. The outside of the rotary structure 320 may move to the outside of the fixed structure 310 while the guide rails 325 rotate about the virtual axis of rotation H1 or H2 along the guide structures 345.

The rotary structure 320 may be inserted in the first rotational direction in which the first rotary structure 320a rotates from the flat state to the folded state. The insertion directions of the first rotary structure 320a, such as the counterclockwise direction, and the second rotary structure 320b, such as the clockwise direction, may be opposite to each other. When the rotary structure 320 is inserted in the insertion direction, the rotary structure 320 may be inserted into the fixed structure 310 without being stopped by the stopper 348.

The assembly direction may restrict the rotary structure 320 to prevent the rotary structure 320 from being separated from the fixed structure 310. For example, when the rotary structure 320 is inserted in a reverse direction to the insertion direction, i.e., when the first rotary structure 320a rotates in the clockwise direction or from an outer to an inner portion of the fixed structure 310, the rotary structure 320 may be separated from the fixed structure 310 by additional folding in the folded state.

An insertion structure, such as the rotary structure 320, may be configured to be separated from an insertion target in a reverse direction to an insertion direction. Accordingly, the rotary structure 320 may be separated from the fixed structure 310 so as to be further unfolded in the flat state. However, the fixed structure 310 of the hinge structure 200 may include the support areas 2161 and 2162 for preventing the rotary structure 320 from being additionally unfolded. Accordingly, the rotary structure 320 may be prevented from being separated (e.g., additionally unfolded) in the reverse direction to the insertion direction even though the rotary structure 320 is inserted into the fixed structure 310 in the direction in which the rotary structure 320 rotates from the flat state to the folded state.

The hinge structure 200 may include the stopper 348 for preventing additional folding, and the rotary structure 320, when assembled, may be inserted into the fixed structure 310 in the first rotational direction in which the rotary structure 320 rotates from the flat state to the folded state, such that the rotary structure 320 is not stopped by the stopper 348.

As disclosed herein, a hinge module may include a hinge housing 150 and a hinge structure 200 disposed in the hinge housing 150. The hinge structure 200 may include a fixed structure 210 including a front surface 211, a rear surface 212 opposite to the front surface 211 and fixed to the inside of the hinge housing 150, and a side surface 213 formed between the front surface 211 and the rear surface 212, a first recess structure 240 that forms a first recess 2401 that is concavely formed on the front surface 211 of the fixed structure 210, the first recess structure 240 including a first inner wall 241 facing toward the first recess 2401, a second inner wall 242 opposite the first inner wall 241, and a first bottom surface 244 formed between the first inner wall 241 and the second inner wall 242, in which a first stopper 248 protruding toward the front surface 211 of the fixed structure 210 is formed on the first bottom surface 244, a second recess structure 250 that forms a second recess 2501 that is concavely formed on the front surface 211 of the fixed structure 210, the second recess structure 250 including a third inner wall 251 facing toward the second recess 2501, a fourth inner wall 252 opposite the third inner wall 251, and a second bottom surface 254 formed between the third inner wall 251 and the fourth inner wall 252, in which a second stopper 258 protruding toward the front surface 211 of the fixed structure 210 is formed on the second bottom surface 254, a first rotary structure 220 that is disposed between the first inner wall 241 and the second inner wall 242 and that rotates about a first virtual axis of rotation H1, the first rotary structure 220 including a first support portion 3201 facing the first inner wall 241, a second support portion 3202 facing the second inner wall 242, and a first receiving groove 3202 that is formed between the first support portion 3201 and the second support portion 3202 and in which at least part of the first stopper 248 is received, and a second rotary structure 230 that is disposed between the third inner wall 251 and the fourth inner wall 252 and that rotates about a second virtual axis of rotation H2 that is parallel to the first virtual axis of rotation, the second rotary structure 230 including a third support portion 3201 facing the third inner wall 251, a fourth support portion 3202 facing the fourth inner wall 252, and a second receiving groove 3203 that is formed between the third support portion 3201 and the fourth support portion 3202 and in which at least part of the second stopper 258 is to received.

The first stopper 248 may protrude from the first bottom surface 244 such that a distance from the first stopper to the first virtual axis of rotation H1 is smaller than a maximum radius of rotation of the first rotary structure 220 with the first virtual axis of rotation H1 as the center thereof, and the second stopper 258 may protrude from the second bottom surface 254 such that a distance from the second stopper to the second virtual axis of rotation H2 is smaller than a maximum radius of rotation of the second rotary structure 230 with the second virtual axis of rotation H2 as the center thereof.

The first recess structure 240 may be formed such that the first recess 2401 is open in a third direction that is perpendicular to a direction of the first virtual axis of rotation H1 and a direction of the second virtual axis of rotation H2, and the second recess structure 250 may be formed such that the second recess 2501 is open in a fourth direction opposite to the third direction.

The first receiving groove 3203 may include a third bottom surface 3204 formed between the first support portion 3201 and the second support portion 3202 of the first rotary structure 220, the first stopper 248 may be configured to make contact with one end portion of the third bottom surface 3204 to restrict a rotation angle of the first rotary structure 220, the second receiving groove 3203 may include a fourth bottom surface 3204 formed between the third support portion 3201 and the fourth support portion 3202 of the second rotary structure 230, and the second stopper 258 may be configured to make contact with one end portion of the fourth bottom surface 3204 to restrict a rotation angle of the second rotary structure 230.

The third bottom surface 3204 may include a first contact area 3205 formed on an end portion thereof that faces the fourth direction, and the first contact area 3205 may make contact with the first stopper 248. The fourth bottom surface 3204 may include a second contact area 3205 formed on an end portion thereof that faces the third direction, and the second contact area 3205 may make contact with the second stopper 258.

At least part of the first stopper 248 may be spaced apart from the first virtual axis of rotation H1 by a first distance D1 smaller than a maximum radius of rotation of the third bottom surface 3204, and at least part of the second stopper 258 may be spaced apart from the second virtual axis of rotation H2 by a second distance D1 smaller than a maximum radius of rotation of the fourth bottom surface 3204.

Each of the first inner wall 241 and the second inner wall 242 of the first recess structure 240 may include a first guide structure 245 protruding toward the first rotary structure 220, each of the first support portion 3201 and the second support portion 3202 of the first rotary structure 220 may include a first guide rail 225 in which at least part of the first guide structure 245 is received, each of the third inner wall 251 and the fourth inner wall 252 of the second recess structure 250 may include a second guide structure 255 protruding toward the second rotary structure 230, and each of the third support portion and the fourth support portion of the second rotary structure 230 may include a second guide rail 235 in which at least part of the second guide structure 255 is received.

Each of the first guide rail 225 and the second guide rail 235 may include a first guide portion 225a, 235a having a first radius of curvature from the first virtual axis of rotation H1 and a second guide portion 225b, 235b having a second radius of curvature smaller than the first radius of curvature, and each of the first guide structure 245 and the second guide structure 255 may be disposed between the first guide portion 225a, 235a and the second guide portion 225b, 235b.

The first recess structure 240 may be formed such that the first recess 2401 is open in a third direction that is perpendicular to a direction of the first virtual axis of rotation H1 and a direction of the second virtual axis of rotation H2, the first recess structure 240 may further include a fifth inner wall 252 that forms a fourth direction opposite to the third direction of the first recess 2401, the fifth inner wall 252 may be spaced apart from the first guide structure 245 by a predetermined interval, the second recess structure 250 may be formed such that the second recess 2501 is open in the fourth direction, the second recess structure 250 may further include a sixth inner wall 253 that forms the third direction of the second recess 2501, and the sixth inner wall 253 may be spaced apart from the second guide structure 255 by a predetermined interval.

Each of the first recess 2401 and the second recess 2501, when viewed from above, may include a first portion 240a formed to have a first length L1 in a direction of the first virtual axis of rotation and a direction of the second virtual axis of rotation from the outside of the fixed structure 210 to the inside of the fixed structure 210, and a second portion 240b extending toward the inside of the fixed structure 210 from the first portion 240a and having a second length L2 greater than the first length L1, and the second length L2 may be substantially the same as a length of the first rotary structure 220 in the direction of the first virtual axis of rotation H1 and a length of the second rotary structure 230 in the direction of the second virtual axis of rotation H2.

The first guide structure 245 and the first guide rail 225 may be formed in a circular arc shape with the first virtual axis of rotation H1 as the center thereof, the second guide structure 255 and the second guide rail 235 may be formed in a circular arc shape with the second virtual axis of rotation H2 as the center thereof, an angle of arc of the first guide structure 245 may be smaller than an angle of arc of the first guide rail 255, and an angle of arc of the second guide structure 255 may be smaller than an angle of arc of the second guide rail 235.

The first virtual axis of rotation H1 and the second virtual axis of rotation H2 may be formed at positions spaced apart from the front surface 211 of the fixed structure 210 by a predetermined interval.

Each of the first guide structure 245 and the second guide structure 255 may form part of the front surface 211 of the fixed structure 210.

Each of the first support portion 3201 and the second support portion 3202 may include a first curved surface that has a first radius of curvature from the first virtual axis of rotation H1 and that is at least partially supported on the first bottom surface 244, and each of the third support portion 3201 and the fourth support portion 3202 may include a second curved surface that has a second radius of curvature from the second virtual axis of rotation H2 and that is at least partially supported on the second bottom surface 254.

The first bottom surface 244 may include a first corresponding curved surface, at least part of which corresponds to the first curved surface, and the second bottom surface 254 may include a second corresponding curved surface, at least part of which corresponds to the second curved surface.

The first radius of curvature and the second radius of curvature may be identical.

As disclosed herein, an electronic device 100 may include a housing structure including a first housing 121, a second housing 122, and a hinge housing 150 disposed between the first housing 121 and the second housing 122, a flexible display 110 disposed on the housing structure so as to extend from the first housing 121 to the second housing 122, the flexible display 110 including a first area 111 formed of a flat surface, a second area 112 formed of a flat surface, and a folding area 113 formed between the first area 11 and the second area 112 and formed of a flat surface or a curved surface, and a hinge structure 200 disposed in the hinge housing 150, the hinge structure being disposed between the first housing 121 and the second housing 122 to rotate the first housing 121 and the second housing 122 about a folding axis.

The hinge structure 200 may include a fixed structure 210 fixed to the inside of the hinge housing 150, a first rotary structure 220 connected with the first housing 121 and coupled to the fixed structure 210 so as to be rotatable about a first virtual axis of rotation H1, and a second rotary structure 230 connected with the second housing 122 and coupled to the fixed structure 210 so as to be rotatable about a second virtual axis of rotation H2.

The fixed structure 210 may include a first recess 2410 in which at least part of the first rotary structure 220 is disposed, a first stopper 248 protruding from a bottom surface 244 of the first recess 2401 in a direction toward the flexible display 110, a second recess 2501 in which at least part of the second rotary structure 230 is disposed, and a second stopper 258 protruding from a bottom surface 254 of the second recess 2501 in the direction toward the flexible display 110. The first rotary structure 220 may include a first receiving groove 3203 in which at least part of the first stopper 248 is received, and the second rotary structure 230 may include a second receiving groove 3203 in which at least part of the second stopper 258 is received. The first stopper 248 may make contact with a bottom surface 3204 of the first receiving groove 3203 when the first rotary structure 220 reaches a maximum rotation angle, and the second stopper 258 may make contact with a bottom surface 3204 of the second receiving groove 3203 when the second rotary structure 230 reaches a maximum rotation angle.

The fixed structure 210 may include a front surface 211 on which the first recess 2401 and the second recess 2501 are formed and a rear surface 212 opposite to the front surface 211 and fixed to the inside of the hinge housing 150, the first recess 2401 may be open in one direction perpendicular to an extension direction of the folding axis, and the second recess 2501 may be open in an opposite direction perpendicular to the extension direction of the folding axis.

An end portion of the bottom surface 3204 of the first receiving groove 3203 that is located toward an open one side of the first recess 2401 may be spaced apart from the first virtual axis of rotation H1 by a first distance, the first stopper 248 formed on the bottom surface of the first recess 2401 may be spaced apart from the first virtual axis of rotation H1 by a second distance shorter than the first distance, an end portion of the bottom surface 3204 of the second receiving groove 3203 that is located toward an open opposite side of the second recess 2501 may be spaced apart from the first virtual axis of rotation H1 by the first distance, and the second stopper formed on the bottom surface of the second recess 2501 may be spaced apart from the first virtual axis of rotation H1 by the second distance.

The first recess 2401, when viewed from above, may include a first portion 340a adjacent to the first housing 121 and extending by a first length in a direction of the first virtual axis of rotation H1 and a second portion 340b adjacent to the second housing 122 and extending by a second length greater than the first length in the direction of the first virtual axis of rotation H1, and the second recess 2501, when viewed from above, may include a third portion 340a adjacent to the second housing 122 and extending by the first length in a direction of the second virtual axis of rotation H2 and a fourth portion 340b adjacent to the first housing 121 and extending by the second length in the direction of the second virtual axis of rotation H2.

The fixed structure further 210 may further include a first guide structure 245 protruding toward the first rotary structure 220 and a second guide structure 255 protruding toward the second rotary structure 230, the first rotary structure 220 may include a first guide rail 225 in which at least part of the first guide structure 245 is received, the second rotary structure 230 may include a second guide rail 235 in which at least part of the second guide structure 255 is received, the first guide structure 245 and the first guide rail 225 may be formed in a circular arc shape with the first virtual axis of rotation H1 as the center thereof, the second guide structure 255 and the second guide rail 235 may be formed in a circular arc shape with the second virtual axis of rotation H2 as the center thereof, an angle of arc of the first guide structure 245 may be smaller than an angle of arc of the first guide rail 225, and an angle of arc of the second guide structure 255 may be smaller than an angle of arc of the second guide rail 235.

The rotary structures may be inserted into the recesses formed on the fixed structure, and the recesses may support at least the opposite sides of the rotary structures in the directions of the axes of rotation. Accordingly, the displacements of the rotary structures in the directions of the axes of rotation may be fixed.

The bottom surfaces of the recesses formed on the fixed structure may include the stoppers that make contact with parts of the rotary structures when the rotary structures reach the stop angle. Accordingly, the rotation angles of the rotary structures may be restricted.

Separation of the components constituting the hinge module may be prevented even though an impact is applied to the electronic device.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, the module may be implemented in a form of an application-specific integrated circuit (ASIC).

Various embodiments as set forth herein may be implemented as software including one or more instructions that are stored in a storage medium (e.g., internal memory or external memory) that is readable by a machine, such as the electronic device). For example, a processor of the machine may invoke at least one of the one or more instructions stored in the storage medium, and execute it, with or without using one or more other components under the control of the processor. This enables the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" indicates that the storage medium is a tangible device, and does not include a signal, but this term does not differentiate between where data is semi-permanently stored in the storage medium and where the data is temporarily stored in the storage medium.

A method according to an embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration.

Operations performed by the module, the program, or another component may be performed sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A hinge module comprising:

a hinge housing; and a hinge structure disposed in the hinge housing, wherein the hinge structure includes:

a fixed structure including a front surface, a rear surface opposite to the front surface and fixed to the inside of the hinge housing, and a side surface formed between the front surface and the rear surface;

a first recess structure configured to form a first recess that is concavely formed on the front surface of the fixed structure and that is open in a third direction, the first recess structure including a first inner wall facing toward the first recess, a second inner wall opposite the first inner wall, a fifth inner wall configured to form a fourth direction opposite to the third direction of the first recess, and a first bottom surface formed between the first inner wall, the second inner wall, and the fifth inner wall, wherein a first stopper protruding toward the front surface of the fixed structure is formed on the first bottom surface;

a second recess structure configured to form a second recess that is concavely formed on the front surface of the fixed structure and that is open in the fourth direction, the second recess structure including a third inner wall facing toward the second recess, a fourth inner wall opposite the third inner wall, a sixth inner wall configured to form the third direction of the second recess, and a second bottom surface formed between the third inner wall, the fourth inner wall, and the sixth inner wall, wherein a second stopper protruding toward the front surface of the fixed structure is formed on the second bottom surface;

a first rotary structure disposed between the first inner wall and the second inner wall and configured to rotate about a first virtual axis of rotation, the first rotary structure including a first support portion facing the first inner wall, a second support portion facing the second inner wall, and a first receiving groove that is formed between the first support portion and the second support portion and in which at least part of the first stopper is received; and a second rotary structure disposed between the third inner wall and the fourth inner wall and configured to rotate about a second virtual axis of rotation that is parallel to the first virtual axis of rotation, the second rotary structure including a third support portion facing the third inner wall, a fourth support portion facing the fourth inner wall, and a second receiving groove that is formed between the third support portion and the fourth support portion and in which at least part of the second stopper is received, wherein the first stopper protrudes from the first bottom surface such that a distance from the first stopper to the first virtual axis of rotation is less than a maximum radius of rotation of the first rotary structure having the first virtual axis of rotation as a center of the first rotary structure, wherein the second stopper protrudes from the second bottom surface such that a distance from the second stopper to the second virtual axis of rotation is less than a maximum radius of rotation of the second rotary structure having the second virtual axis of rotation as the center of the second rotary structure, and wherein the third direction is perpendicular to a direction of the first virtual axis of rotation and a direction of the second virtual axis of rotation.

2. The hinge module of claim 1, wherein the first receiving groove includes a third bottom surface formed between the first support portion and the second support portion of the first rotary structure, wherein the first stopper is configured to make contact with one end portion of the third bottom surface and to restrict a rotation angle of the first rotary structure, wherein the second receiving groove includes a fourth bottom surface formed between the third support portion and the fourth support portion of the second rotary structure, and wherein the second stopper is configured to make contact with one end portion of the fourth bottom surface and to restrict a rotation angle of the second rotary structure.

3. The hinge module of claim 2, wherein the third bottom surface includes a first contact area formed on an end portion of the third bottom surface that faces the fourth direction, the first contact area being configured to make contact with the first stopper, and wherein the fourth bottom surface includes a second contact area formed on an end portion of the fourth bottom surface that faces the third direction, the second contact area being configured to make contact with the second stopper.

4. The hinge module of claim 2, wherein at least part of the first stopper is spaced apart from the first virtual axis of rotation by a first distance less than a maximum radius of rotation of the third bottom surface, and wherein at least part of the second stopper is spaced apart from the second virtual axis of rotation by a second distance less than a maximum radius of rotation of the fourth bottom surface.

5. The hinge module of claim 1, wherein each of the first inner wall and the second inner wall of the first recess structure includes a first guide structure protruding toward the first rotary structure, wherein each of the first support portion and the second support portion of the first rotary structure includes a first guide rail in which at least part of the first guide structure is received, wherein each of the third inner wall and the fourth inner wall of the second recess structure includes a second guide structure protruding toward the second rotary structure, and wherein each of the third support portion and the fourth support portion of the second rotary structure includes a second guide rail in which at least part of the second guide structure is received.

6. The hinge module of claim 5, wherein each of the first guide rail and the second guide rail includes a first guide portion having a first radius of curvature from the first virtual axis of rotation and a second guide portion having a second radius of curvature smaller than the first radius of curvature, and wherein each of the first guide structure and the second guide structure is disposed between the first guide portion and the second guide portion.

7. The hinge module of claim 5, wherein the fifth inner wall is spaced apart from the first guide structure by a predetermined interval, and wherein the sixth inner wall is spaced apart from the second guide structure by a predetermined interval.

8. The hinge module of claim 1,
wherein each of the first recess and the second recess, when viewed from above the first recess and the second recess, includes a first portion formed to have a first length in a direction of the first virtual axis of rotation and a direction of the second virtual axis of rotation from the outside of the fixed structure to the inside of the fixed structure, and a second portion extending toward the inside of the fixed structure from the first portion and having a second length greater than the first length, and
wherein the second length is identical to a length of the first rotary structure in the direction of the first virtual axis of rotation and a length of the second rotary structure in the direction of the second virtual axis of rotation.

9. The hinge module of claim 5,
wherein the first guide structure and the first guide rail are formed in a first circular arc shape having the first virtual axis of rotation as a center of the first circular arc shape,
wherein the second guide structure and the second guide rail are formed in a second circular arc shape having the second virtual axis of rotation as the center of the second circular arc shape,
wherein an angle of arc of the first guide structure is smaller than an angle of arc of the first guide rail, and
wherein an angle of arc of the second guide structure is smaller than an angle of arc of the second guide rail.

10. The hinge module of claim 1,
wherein the first virtual axis of rotation and the second virtual axis of rotation are formed at positions spaced apart from the front surface of the fixed structure by a predetermined interval.

11. The hinge module of claim 5,
wherein each of the first guide structure and the second guide structure forms part of the front surface of the fixed structure.

12. The hinge module of claim 1,
wherein each of the first support portion and the second support portion includes a first curved surface that has a first radius of curvature from the first virtual axis of rotation and that is at least partially supported on the first bottom surface, and
wherein each of the third support portion and the fourth support portion includes a second curved surface that has a second radius of curvature from the second virtual axis of rotation and that is at least partially supported on the second bottom surface.

13. The hinge module of claim 12, wherein the first bottom surface includes a first corresponding curved surface, at least part of which corresponds to the first curved surface, and
wherein the second bottom surface includes a second corresponding curved surface, at least part of which corresponds to the second curved surface.

14. The hinge module of claim 13, wherein the first radius of curvature and the second radius of curvature are identical.

15. An electronic device comprising the hinge module of claim 1.

\* \* \* \* \*